(12) United States Patent
Kim et al.

(10) Patent No.: US 9,799,496 B2
(45) Date of Patent: Oct. 24, 2017

(54) EDGE EXCLUSION CONTROL WITH ADJUSTABLE PLASMA EXCLUSION ZONE RING

(71) Applicant: Lam Research Corporation, Fremont, CA (US)

(72) Inventors: Keechan Kim, Pleasanton, CA (US); Yansung Kim, Monte Sereno, CA (US)

(73) Assignee: Lam Research Corporation, Fremont, CA (US)

( * ) Notice: Subject to any disclaimer, the term of this patent is extended or adjusted under 35 U.S.C. 154(b) by 37 days.

(21) Appl. No.: 14/920,821

(22) Filed: Oct. 22, 2015

(65) Prior Publication Data

US 2016/0042927 A1    Feb. 11, 2016

Related U.S. Application Data

(62) Division of application No. 13/553,734, filed on Jul. 19, 2012, now Pat. No. 9,184,030.

(51) Int. Cl.
| | |
|---|---|
| *B08B 3/00* | (2006.01) |
| *H01J 37/32* | (2006.01) |
| *B08B 7/00* | (2006.01) |

(52) U.S. Cl.
CPC ...... *H01J 37/32862* (2013.01); *B08B 7/0035* (2013.01); *H01J 37/32091* (2013.01); *H01J 37/32385* (2013.01); *H01J 37/32568* (2013.01); *H01J 37/32623* (2013.01); *H01J 2237/334* (2013.01); *H01J 2237/335* (2013.01)

(58) Field of Classification Search
CPC .......... H01J 37/32091; H01J 37/32568; H01J 37/32862; H01J 2237/335; H01J 2237/334; B08B 7/0035
USPC ................ 134/137; 156/345.48; 313/231.31
See application file for complete search history.

(56) References Cited

U.S. PATENT DOCUMENTS 7,858,898 B2 * 12/2010 Bailey, III ........ H01J 37/32366
                                                        118/723 I

* cited by examiner

*Primary Examiner* — Eric Golightly
(74) *Attorney, Agent, or Firm* — Martine Penilla Group, LLP

(57) ABSTRACT

Systems and methods for edge exclusion control are described. One of the systems includes a plasma chamber. The plasma processing chamber includes a lower electrode having a surface for supporting a substrate. The lower electrode is coupled with a radio frequency (RF) power supply. The plasma processing chamber further includes an upper electrode disposed over the lower electrode. The upper electrode is electrically grounded. The plasma processing chamber includes an upper dielectric ring surrounding the upper electrode. The upper dielectric ring is moved using a mechanism for setting a vertical position of the upper dielectric ring separate from a position of the upper electrode. The system further includes an upper electrode extension surrounding the upper dielectric ring. The upper electrode extension is electrically grounded. The system also includes a lower electrode extension surrounding the lower dielectric ring. The lower electrode extension is arranged opposite the upper electrode extension.

6 Claims, 18 Drawing Sheets

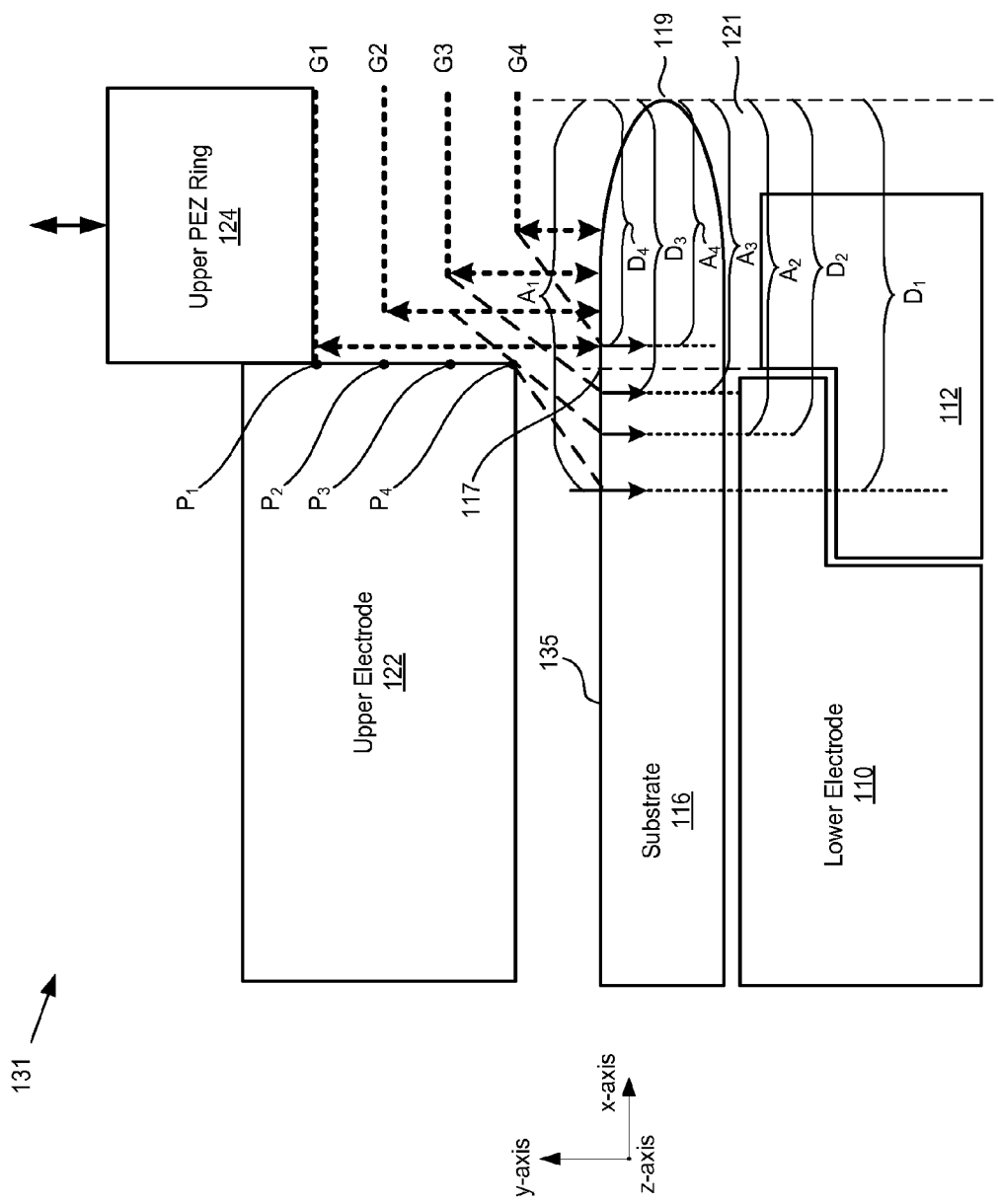

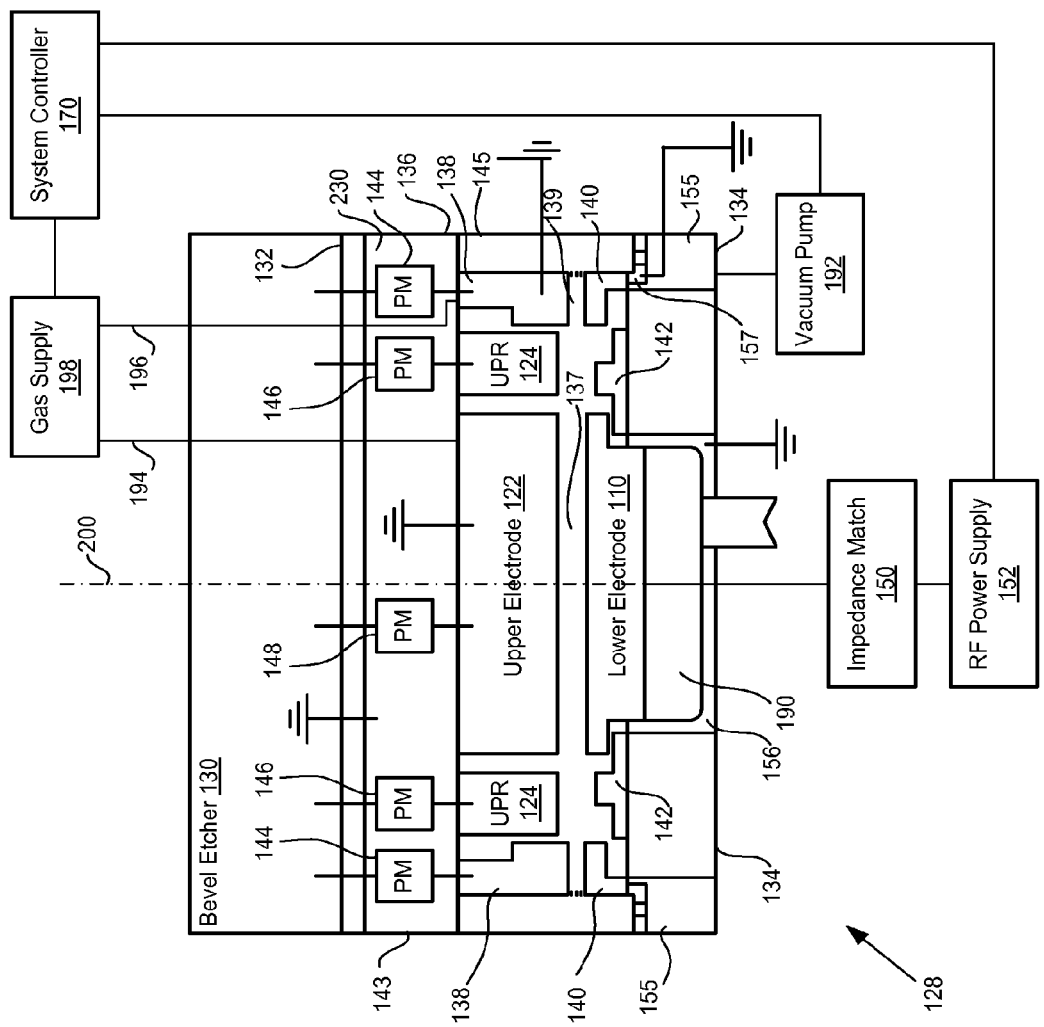

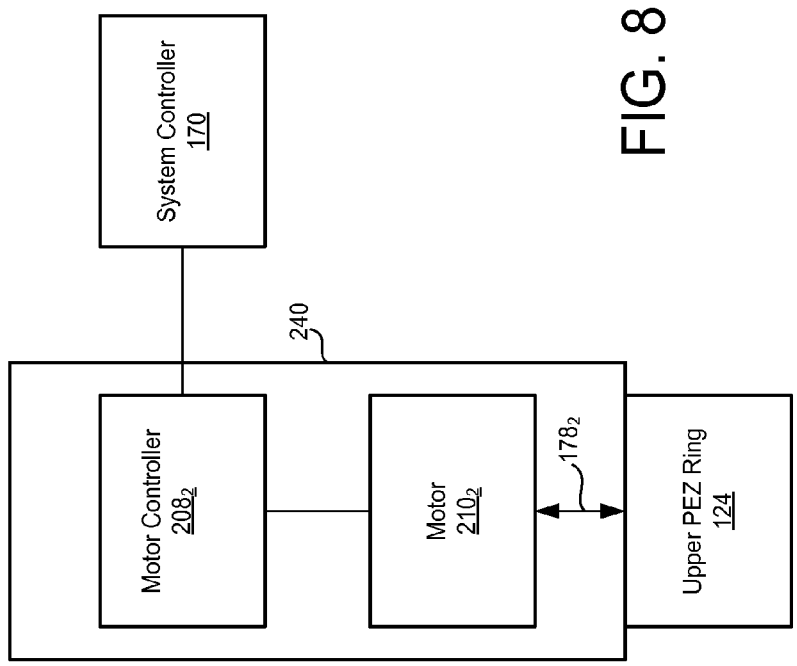

EDGE EXCLUSION CONTROL WITH ADJUSTABLE PLASMA EXCLUSION ZONE RING

CLAIM OF PRIORITY

The present patent application is a divisional of and claims the benefit of and priority, under 35 U.S.C. §120, to U.S. patent application Ser. No. 13/553,734, filed on Jul. 19, 2012, now issued as U.S. Pat. No. 9,184,030 on Nov. 10, 2015, and entitled, "Edge Exclusion Control With Adjustable Plasma Exclusion Zone Ring", which is incorporated by reference herein in its entirety for all purposes.

FIELD

The present embodiments relate to wafer processing apparatus, and more particularly, apparatus, methods, and computer programs for edge exclusion control with adjustable plasma exclusion zone ring.

BACKGROUND

The manufacturing of integrated circuits includes immersing silicon substrates (wafers) containing regions of doped silicon in chemically-reactive plasmas, where the submicron device features (e.g., transistors, capacitors, etc.) are etched onto the surface. Once the first layer is manufactured, several insulating (dielectric) layers are built on top of the first layer, where holes, also referred to as vias, and trenches are etched into the material for placement of the conducting interconnectors. The chemically-reactive plasmas are created in a plasma chamber. This is an illustration of use of etching. Etching may be used to clean the substrate or remove residues from a surface of the substrate.

As an amount of etching changes, hardware of the plasma chamber is changed. Such change in hardware results in an increase in cost and effort used to etch a substrate.

It is in this context that embodiments of the invention arise.

SUMMARY

Embodiments of the disclosure provide apparatus, methods and computer programs for edge exclusion control with adjustable plasma exclusion zone ring. It should be appreciated that the present embodiments can be implemented in numerous ways, e.g., a process, an apparatus, a system, a device, or a method on a computer readable medium. Several embodiments are described below.

In various embodiments, an upper plasma exclusion zone (PEZ) ring is moved independently within a plasma processing chamber to clean different areas of a surface of a substrate that are measured from a bevel edge of the substrate. The upper PEZ ring is moved independent in a vertical direction independent of movement of an upper electrode of the chamber and movement of an upper electrode extension within the chamber. There is no need to use different upper PEZ rings to clean different areas of the substrate surface.

Also, sometimes, when the upper PEZ ring is clamped to the upper electrode to move with the upper electrode, during movement of the upper electrode, a gap between the upper PEZ ring and the substrate increases beyond a certain distance, e.g., 0.6 millimeters (mm), to often cause unconfinement of plasma within the gap. By controlling the movement of the upper PEZ ring independent of movement of the upper electrode, the gap is controlled to avoid the increase in the distance. The smaller the gap, the less the plasma encroachment, which leads to a smaller edge exclusion of a surface area of the substrate from a bevel edge of the substrate. The edge exclusion occurs to perform a processing operation, e.g., cleaning operation, etching operation, depositing operation, etc. on the surface area from the bevel edge. The larger the gap, the more the plasma encroachment, which leads to a large edge exclusion. In a number of embodiments, a gap between the upper electrode and the substrate is maintained between 0.35-0.4 mm and the upper PEZ ring is moved to control edge exclusion and to avoid plasma unconfinement issues. Also, in various embodiments, a gap between the upper electrode extension and the substrate is maintained between 0.35-0.4 mm and the upper PEZ ring is moved to control edge exclusion and to avoid plasma unconfinement issues.

In a number of embodiments, a plasma chamber includes a lower electrode having a surface for supporting a substrate. The lower electrode is coupled with a radio frequency (RF) power supply. The plasma chamber further includes an upper electrode disposed over the lower electrode. The upper electrode is electrically grounded. The plasma chamber includes an upper dielectric ring surrounding the upper electrode. The upper dielectric ring is adjusted using a mechanism for setting a vertical position of the upper dielectric ring. The plasma chamber includes an upper electrode extension surrounding the upper dielectric ring. The upper electrode extension is also electrically grounded. The plasma chamber includes a lower dielectric ring surrounding the lower electrode. The lower dielectric ring is set at a level that is below a level of the surface of the lower electrode. The plasma chamber includes a lower electrode extension surrounding the lower dielectric ring. The lower electrode extension is arranged opposite the upper electrode extension. An edge processing region is defined between the upper and lower dielectric rings and the upper and lower electrode extensions. When the substrate is present on the surface of the lower electrode, an edge of the substrate extends into the edge processing region.

In various embodiments, a plasma processing chamber is described. The plasma processing chamber includes a lower electrode having a surface for supporting a substrate. The lower electrode is coupled with a radio frequency (RF) power supply. The plasma processing chamber includes an upper electrode disposed over the lower electrode. The upper electrode is electrically grounded. The plasma processing chamber further includes an upper dielectric ring surrounding the upper electrode. The upper dielectric ring is moved using a mechanism for setting a vertical position of the upper dielectric ring separate from a position of the upper electrode. The plasma processing chamber further includes an upper electrode extension surrounding the upper dielectric ring. The upper electrode extension is electrically grounded. The plasma processing chamber also includes a lower electrode extension surrounding the lower dielectric ring. The lower electrode extension is arranged opposite the upper electrode extension. An edge processing region is defined between the upper and lower electrode extensions. When the substrate is present on the surface of the lower electrode, an edge of the substrate extends into the edge processing region.

In one embodiment, a plasma processing chamber for bevel edge cleaning is described. The plasma processing chamber includes an upper electrode, a lower electrode positioned below the upper electrode, and an upper plasma exclusion zone (PEZ) ring peripheral to the upper electrode.

The upper PEZ ring is settable to multiple positions toward or away from the lower electrode without vertical adjustment of the upper electrode. The plasma processing chamber further includes an upper electrode extension peripheral to the upper PEZ ring and a lower electrode extension surrounding the lower electrode.

In a number of embodiments, a system for controlling a size of an edge processing region is described. The system includes an upper electrode, an upper PEZ ring configured to reduce an effect of plasma on the upper electrode, a system controller configured to generate signals regarding a first position and a second position of the upper PEZ ring, an actuator, and a position controller. The position controller is configured to control the actuator based on the signals to achieve the first position and the second position. The first and second positions are achieved independent of movement of the upper electrode.

In several embodiments, a method for bevel edge cleaning is described. The method includes positioning a lower electrode below an upper electrode, placing an upper electrode extension peripheral to the upper electrode, placing a lower electrode extension peripheral to the lower electrode, and situating an upper PEZ ring between the upper electrode and the upper electrode extension. The method further includes engaging the PEZ ring with multiple positions while maintaining the upper electrode at a position.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 2 is a diagram of a system for using an upper plasma exclusion zone (PEZ) ring to generate various gaps G1 thru G4 to create various edge processing regions, in accordance with an embodiment of the invention.

FIG. 3 is a diagram of a system for generating various gaps between a lower PEZ ring and the upper PEZ ring, in accordance with an embodiment of the invention.

FIG. 8 is a block diagram of a system for controlling a position of the upper PEZ ring via a motor, in accordance with an embodiment of the invention.

DETAILED DESCRIPTION

The following embodiments describe systems and methods for edge exclusion control with movement of plasma exclusion zone ring. It will be apparent that the present embodiments may be practiced without some or all of these specific details. In other instances, well known process operations have not been described in detail in order not to unnecessarily obscure the present embodiments.

Figure 1A:
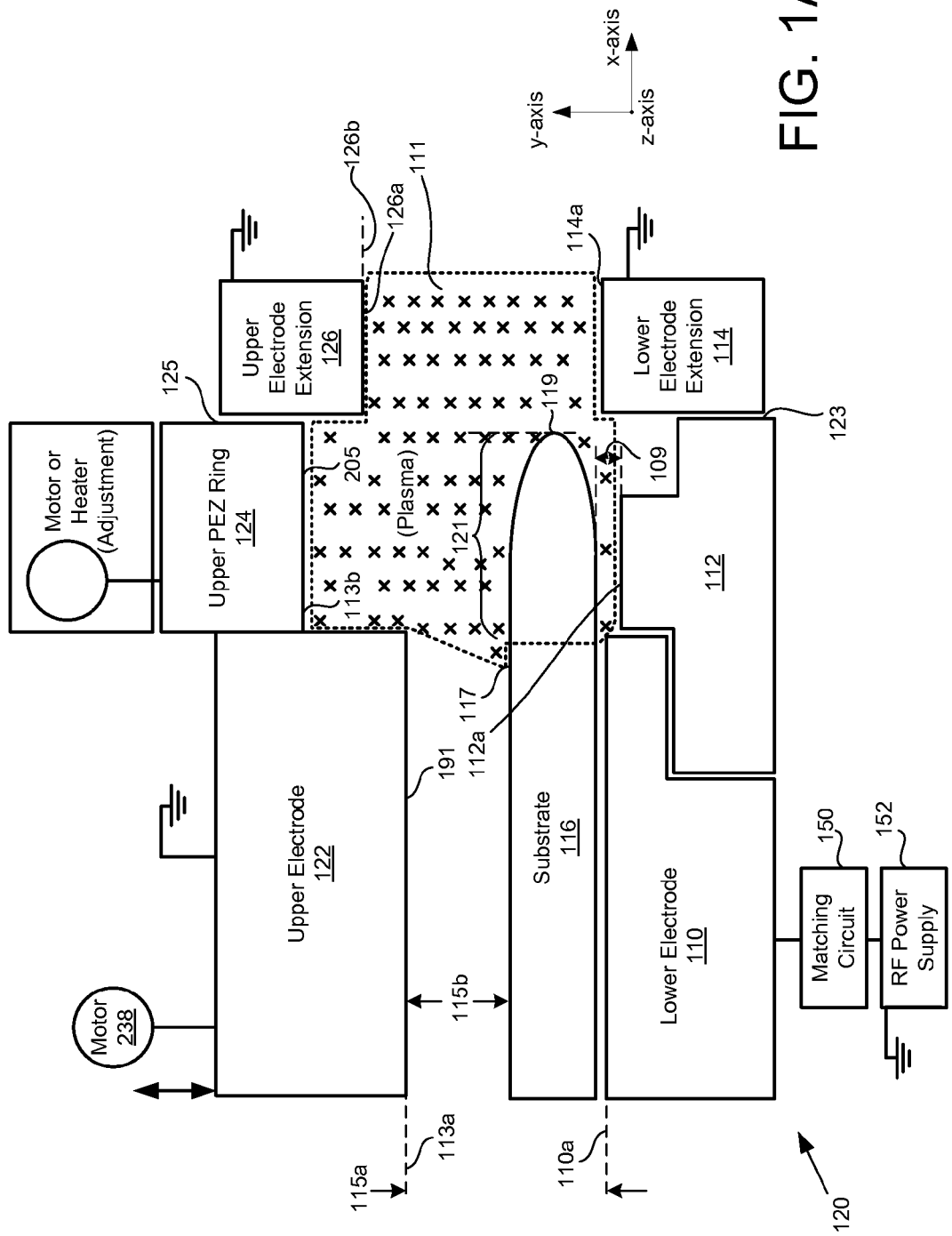
FIG. 1A is a diagram of a system for changing a gap associated with an edge processing region, in accordance with an embodiment of the invention.

FIG. 1A is a diagram of an embodiment of a system 120 for changing a gap associated with an edge processing region 111. The system 120 includes an upper electrode assembly, which further includes an upper electrode 122, an upper plasma exclusion zone (PEZ) ring 124, and an upper electrode extension (UEE) 126, which has a lower surface 126a at a level 126b. It should be noted that in some embodiments, a PEZ ring and a "dielectric ring" are used interchangeably herein. The upper PEZ ring 124 is located horizontally between the upper electrode 122 and the UEE 126. Also, the upper PEZ ring 124 is located at a periphery of the upper electrode 122. The upper PEZ ring 124 shields, e.g., protects, the upper electrode 122 from plasma generated within the edge processing region 111. For example, the upper PEZ ring 124 reduces an effect of plasma on the upper electrode 122. The UEE 126 is located at a periphery of the upper PEZ ring 124. The upper PEZ ring 124 horizontally surrounds the upper electrode 122 and the UEE 126 horizontally surrounds the upper PEZ ring 124.

The upper PEZ ring 124 lacks a flange and the upper electrode 122 also lacks a flange that engages with the flange of the upper PEZ ring 124 to clamp the upper PEZ ring 124. For example, the upper PEZ ring 124 is of a polygonal shape, e.g., square, rectangle, etc. In various embodiments, the upper electrode 122 acts as a dielectric. The UEE 126 is formed of aluminum, pure silicon (Si), chemical vapor deposited (CVD) Si, or any suitable high-purity conductive material.

The system 120 further includes a lower electrode assembly, which further includes a lower electrode 110, a lower PEZ ring 112, and a lower electrode extension (LEE) 114, which has a top surface 114a. The lower electrode 110 is located below the upper electrode 122. A gap 115a is formed between a level 113a of a bottom surface 191 of the upper electrode 122 and a level 110a of a top surface of the lower electrode 110.

The lower PEZ ring 112 is located horizontally between the lower electrode 110 and the LEE 114. For example, the lower PEZ ring 112 is located at a periphery of the lower electrode 110 and the LEE 114 is located at a periphery of the lower PEZ ring 112. The LEE 114 horizontally surrounds the lower PEZ ring 112 and the lower PEZ ring 112 horizontally surrounds the lower electrode 110. A substrate 116 is situated on the lower electrode 110 for cleaning the substrate 116. A gap 109 is formed between a top surface 112a of the lower PEZ ring 112 and a lower surface of the substrate 116.

In various embodiments, the top surface 112a of the lower PEZ ring 112 is set at a level that is below the level 110a of the top surface of the lower electrode 110. In a number of embodiments, the top surface 112a of the lower PEZ ring 112 is set at a level that is same as the level 110a of the top surface of the lower electrode 110.

In several embodiments, the top surface 114a of the lower electrode extension 114 is at a level higher than a level of the top surface 112a of the lower PEZ ring 112. In various embodiments, top surface 114a of the lower electrode extension 114 is at a level lower than or same as the level of the top surface 112a of the lower PEZ ring 112.

Examples of cleaning operations include removing residues, e.g., polymers, from a top surface of substrate 116 upto 0.5 millimeters (mm) from the edge 119, removing Tungsten/Titanium Nitride (W/TiN) layers from the top surface of substrate 116 up to 1 mm from the edge 119, and/or removing oxide/nitride on the top surface of substrate 116 from the edge 119 upto a distance from the edge 119. The residues may be created during fabrication of the substrate 116 and/or electrical circuitry on top of the substrate 116. All cleaning operations are performed using the same upper PEZ ring 124 and by moving the upper PEZ ring 124 between different positions, which are described below. In several embodiments, any other operation, e.g., etching, depositing, etc., is performed on the substrate 116 with the system 120.

Each of the lower electrode 110 and the LEE 114 is formed of a metal, e.g., anodized aluminum, an aluminum alloy, etc. Moreover, each of the upper PEZ ring 124 and the lower PEZ ring 112 is fabricated from an electrically conductive, semiconductive or dielectric material. For example, each of the upper PEZ ring 1204 and the lower PEZ ring 112 is made of a dielectric material, e.g., aluminum oxide ($Al_2O_3$), aluminum nitride (AlN), silicon oxide ($SiO_2$), silicon carbide (SiC), silicon nitride ($Si_3N_4$), silicon (Si), and yttria ($Y_2O_3$). In several embodiments, each of the upper PEZ ring 124 and the lower PEZ ring 112 is a composite ring of metal, ceramic or polymer coated with a conductive or dielectric material.

An edge exclusion region 121 is formed between a portion 117 on the substrate 116 and an edge 119 of the substrate 116. For example, the edge exclusion region 121 ranges from less than 1 mm to 2 mm on the substrate 116 from the edge 119. As another example, the edge exclusion region 121 ranges from less than 0.5 mm to 2 mm on the substrate 116 from the edge 119. In various embodiments, the portion 117 is a circle that extends along a periphery of the substrate 116. In several embodiments, an opposite edge 123 of the lower PEZ ring 112 is aligned with an edge 125 of the upper PEZ ring 124 along a y-axis. The edge 123 is located opposite to the edge 117. In a number of embodiments, the edge 123 lacks alignment with the edge 125. Various residues, e.g., polymers are removed from the edge exclusion region 121 using plasma that is generated within an edge processing region. In a number of embodiments, the edge exclusion region 121 lacks electrical circuitry, e.g., transistors, capacitors, resistors, etc.

When a process gas is supplied within an edge processing region 111, a radio frequency (RF) power supply 152 supplies RF power via an impedance matching circuit 150 to the lower electrode 110. Also, each of the upper electrode 122, the UEE 126, and the LEE 114 are grounded. The edge processing region 111 is located between the upper PEZ ring 124, the lower PEZ ring 112, the UEE 126, and the LEE 114. Examples of the process gas are provided below. When the process gas and the RF power are supplied, plasma is struck in the edge processing region 111.

A motor 238 is used to move the upper electrode 122. The motor 238 is other than a motor or a heater that is used to move the upper PEZ ring 124. For example, the motor 238 operates to change a position of the upper electrode 122 independent of the motor or heater that operates to change a position of the upper PEZ ring 124. As another example, there is no need to operate the motor 238 when the motor or heater is operated to change a position of the upper PEZ ring 124.

In various embodiments, the upper PEZ ring 124 is moved independent of movement of the upper electrode 122 to facilitate a difference between the level 113a of the bottom surface 191 of the upper electrode 122 and a level 113b of a bottom surface 205 of the upper PEZ ring 124. The difference between the levels 113a and 113b is measured along the y-axis. In a number of embodiments, when the bottom surface 205 of the upper PEZ ring 124 is at the level 113b, the upper PEZ ring 124 is recessed away from the level 113a of the upper electrode 122 in a vertical direction away from the lower PEZ ring 112. The upper PEZ ring 124 is recessed away by the motor or heater coupled with the upper PEZ ring 124.

In several embodiments, the upper PEZ ring 124 is moved independent of movement of the UEE 126 to facilitate a difference between the level 126b of the bottom surface 126a of the UEE 126 and the level 113b of the upper PEZ ring 124. The difference between the level 126b of the bottom surface 126a and the level 113b is measured along the y-axis. In a number of embodiments, when the bottom surface 205 of the upper PEZ ring 124 is at the level 113b, the upper PEZ ring 124 is recessed away from the level 126b of the bottom surface 126a of the UEE 126 in a vertical direction away from the lower PEZ ring 112.

In several embodiments, a gap 115b between the lower surface of the upper electrode 122 and a top surface of the substrate 116 is maintained to not allow plasma from encroaching between the upper electrode 122 and the lower electrode 110. For example, the gap 115*b* is less than 1 mm. As another example, the gap 115*b* is less than 0.4 mm. As yet another example, the gap 115*b* is less than 0.6 mm.

Figure 1B:
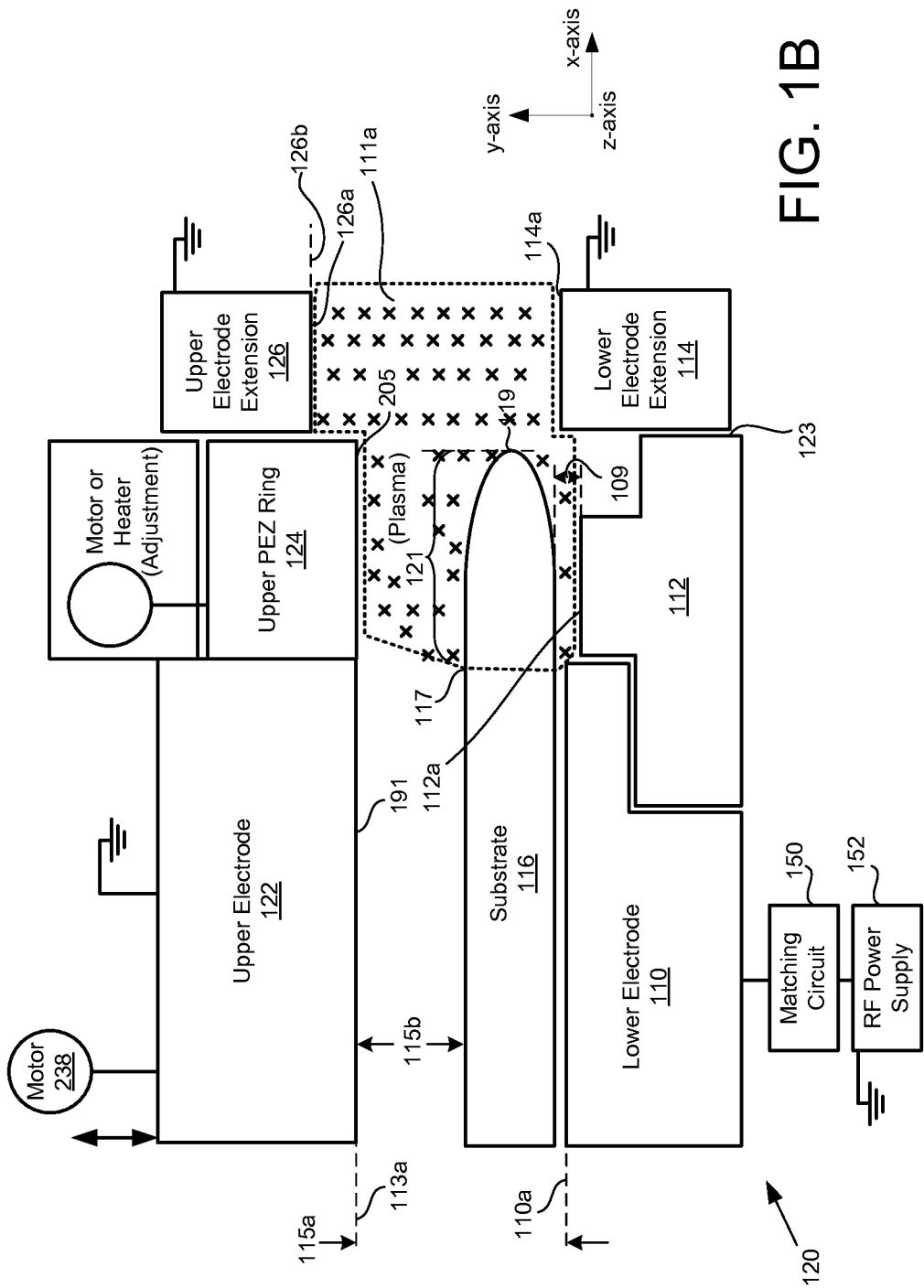
FIG. 1B is a diagram of a system in which a gap associated with an edge processing region is different than that in FIG. 1A, in accordance with an embodiment of the invention.

FIG. 1B is a diagram of an embodiment of the system 120 in which a gap associated with an edge processing region is different than that in FIG. 1A. As shown in FIG. 1B, the bottom surface 205 of the upper PEZ ring 124 is at the same level 113*a* as that of the upper electrode 122. For example, the bottom surface 205 of the upper PEZ ring 124 is coplanar with the lower surface 191 of the upper electrode 122. The motor or heater coupled with the upper PEZ ring 124 moves the upper PEZ ring 124 to achieve the level 113*a* or any other level.

Also, an edge processing region 111*a* has a smaller volume than that of the edge processing region 111 (FIG. 1A) when a distance between the level 113*a* (FIG. 1A) and the lower PEZ ring 112 is less than a distance between the level 113*b* and the lower PEZ ring 112. For example, plasma within the edge processing region 111*a* encroaches upon a lesser surface area on a top surface of the substrate 116 within the edge exclusion region 121 than that encroached by plasma within the edge processing region 111.

In a number of embodiments, the bottom surface 205 of the upper PEZ ring 124 is at the same level 113*a* as that of level 126*b* of the bottom surface 126*a* of the UEE 126. In various embodiments, the bottom surface 205 of the upper PEZ ring 124 is at the same level as that of the bottom surface 126*a* of the UEE 126 and of the bottom surface 191 of the upper electrode 122.

Figure 1C:
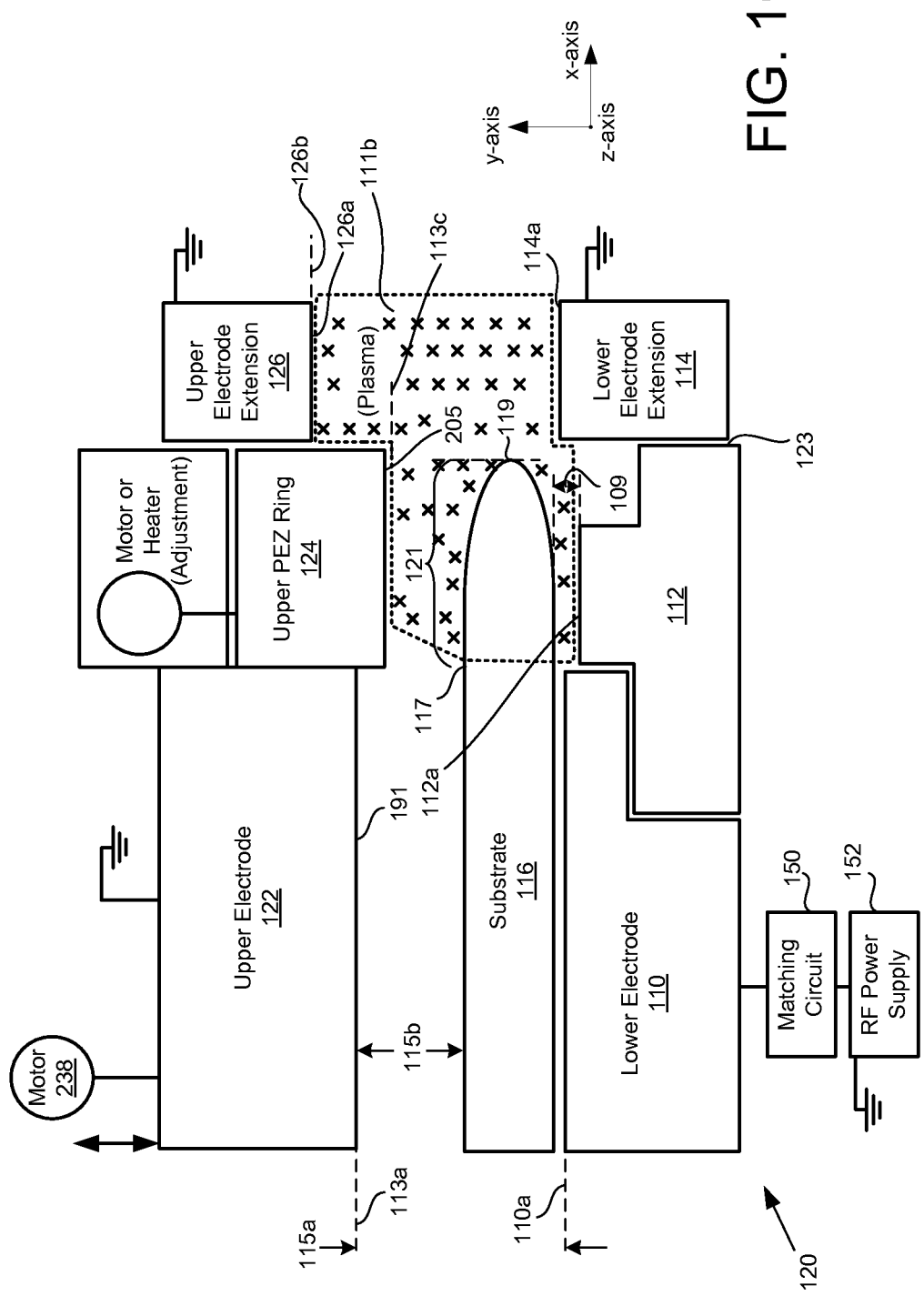
FIG. 1C is a diagram of a system in which a gap associated with an edge processing region is different than that in FIGS. 1A and 1B, in accordance with an embodiment of the invention.

FIG. 1C is a diagram of an embodiment of the system 120 in which a gap associated with an edge processing region is different than that in FIG. 1A and than that in FIG. 1B. As shown in FIG. 1C, the bottom surface 205 of the upper PEZ ring 124 is below the level 113*a* of the upper electrode 122. The upper PEZ ring 124 is moved to protrude past the level 113*a* of the upper electrode 122 in a downward vertical direction toward the lower PEZ ring 112 to achieve a level 113*c*. Also, an edge processing region 111*b* has a smaller volume than that of the edge processing region 111*a* (FIG. 1B) when a distance between the level 113*c* and the lower PEZ ring 112 is less than a distance between the level 113*a* (FIG. 1B) and the lower PEZ ring 112. For example, plasma within the edge processing region 111*b* encroaches upon a lesser surface area on a top surface of the substrate 116 within the edge exclusion region 121 than that encroached by plasma within the edge processing region 111*a*.

In a number of embodiments, the bottom surface 205 of the upper PEZ ring 124 is below the level 126*b* of the bottom surface 126*a* of the UEE 126. In various embodiments, the bottom surface 205 of the upper PEZ ring 124 is between a level of the lower surface 191 of the upper electrode 122 and a level of the lower surface 126*a* of the UEE 126.

FIG. 2 is a diagram of an embodiment of a system 131 for using the upper PEZ ring 124 to generate various gaps G1 thru G4 to create various edge processing regions. With change in the gaps, a surface area of a top surface of the substrate 116 within the edge exclusion zone 121 that is encroached by plasma within an edge processing region changes. For example, when the gap between the upper PEZ ring 124 and the substrate 116 changes from G2 to G1, top surface area of the substrate 116 that is encroached by plasma within an edge processing region increases. As another example, when the gap between the upper PEZ ring 124 and the substrate 116 changes from G3 to G4, top surface area of the substrate 116 that is encroached by plasma within an edge processing region decreases.

When the gap G1 is created, an amount of etching occurs on a surface area A1 at a distance D1 from the edge 119. Moreover, when the gap G2 is created, an amount of etching occurs on a surface area A2 at a distance D2 from the edge 119. Also, when the gap G3 is created, an amount of etching occurs on a surface area A3 at a distance D3 from the edge 119. When the gap G4 is created, an amount of etching occurs on a surface area A4 at a distance D4 from the edge 119.

Each gap G1, G2, G3, and G4 is formed between a bottom surface 205 of the upper PEZ ring 124 and a top surface 135 of the substrate 116. The upper PEZ ring 124 is moved between four different positions, e.g., P1 thru P4, to generate the gaps G1 thru G4. As shown, in various embodiments, there is lack of movement, e.g., vertical movement, of the upper electrode 122 and/or the UEE 126 during movement of the upper PEZ ring 124 between the four different positions P1 thru P4. There is no need to move the upper electrode 122 and/or the UEE 126 at a time the upper PEZ ring 124 is moved between the four positions P1 thru P4.

In a variety of embodiments, the upper electrode 122 is moved between the four positions P1 thru P4 simultaneous with movement of the upper PEZ ring 124 between the positions P1 thru P4. For example, the upper electrode 122 is moved to a different position than a position of the upper PEZ ring 124. For example, the upper electrode 122 is moved to the position P4 and the upper PEZ ring 124 is moved to the position P3. As another example the upper electrode 122 is moved to the position P1 and the upper PEZ ring 124 is moved to the position P2. In several embodiments, the upper electrode 122 and the upper PEZ ring 124 are moved to the same position simultaneously.

The change in the positions P1 thru P4 changes the gaps G1 thru G4. The change in the gaps G1 thru G4 changes a surface area of substrate 116 that is encroached upon by plasma within an edge processing region. For example, as the gap changes from G1 thru G4, the surface area changes from A1 thru A4 and a lower amount of plasma than that encroached by the plasma within the gap G1 encroaches on the substrate 116. As another example, as the gap changes to G3, the surface area changes to A3.

It should be noted that the above-described embodiments are described with respect to four gaps G1 thru G4, four positions P1 thru P4, and four surface areas A1 thru A4. In several embodiments, the embodiments may be described with respect to any number of gaps and the number is the same as that of positions of the upper PEZ ring 124 and surface areas of the substrate 116 from the edge 119.

FIG. 3 is a diagram of an embodiment of a system 128 for generating various gaps between a lower PEZ ring 142 and the upper PEZ ring 124. The system 128 includes a bevel etcher 130, a system controller 170, and a gas supply 198. As used herein, the terms controller, central processing unit, processor, microprocessor, application specific integrated circuit, and programmable logic device are used interchangeably. The system 128 further includes the impedance matching circuit 150, the RF power supply 152, and a vacuum pump 192.

The system controller 170 sends a signal to the gas supply 198 to supply the process gas via a center gas feed 194 to an upper electrode 122 within the bevel etcher 130. The upper electrode 122 is coupled with ground, e.g., a ground voltage. The process gas is supplied via the upper electrode 122 to a gap 137 between the upper electrode 122 and the bottom electrode 110 of the bevel etcher 130 to clean the substrate 116 (FIG. 2). Examples of the process gases include an oxygen-containing gas, such as $O_2$. Other examples of the process gas include a fluorine-containing gas, e.g., $CF_4$, $SF_6$, $C_2F_6$, etc.

When the process gas is supplied within the gap 137 and a signal is received by the RF power supply 152 from the system controller 170, the RF power supply 152 provides an RF power via the impedance matching circuit 150 to the lower electrode 110 to energize the gas to generate plasma within the gap 137. The electrodes 122 and 110 are centered with respect to a center line 200. In several embodiments, the RF power supply 152 supplies power at frequencies ranging from 2 megahertz (MHz) to 60 MHz. In various embodiments, instead of the RF power supply 152, multiple RF power supplies of different frequencies, e.g., a first RF power supply operated at 2 MHz, a second RF power supply operated at 27 MHz, and a third power supply operated at 60 MHz, are coupled with the impedance matching circuit 150 to supply RF power to the lower electrode 110.

Similarly, when a signal is received from the system controller 170, the gas supply 198 supplies the process gas via an edge gas feed 196 to an UEE 138 of the bevel etcher 130. The UEE 138 is coupled with ground. The process gas enters a gap 139 between the UEE 138 and an LEE 140. The LEE 140 is grounded via a lower metal collar 157. An example of the lower metal collar is provided in U.S. Pat. No. 7,858,898, which is incorporated by reference herein in its entirety.

When the process gas is supplied within the gap 139, the RF power supply 152 supplies RF power via the impedance matching circuit 150 and the lower electrode 110 to the LEE 140 to energize the process gas within the gap 139. When the process gas within the gap 139 is energized by RF power of the RF power supply 152, plasma is generated within the gap 139 to clean a bevel edge of the substrate 116 (FIG. 2). The RF power supply 152 supplies RF power to the lower electrode 110 upon receiving a signal from the system controller 170. The impedance matching circuit 150 matches an impedance of the RF power supply 152 with an impedance of plasma created within the gap 137 or 139.

The bevel etcher 130 includes a plasma chamber 136 that has a top wall 132, a bottom wall 134 and two side walls 143 and 145. In several embodiments, at least a portion of the bottom wall 134 is integrally form with at least a portion of the side wall 143 and at least a portion of the side wall 145. In various embodiments, at least a portion of the top wall 132 is integrally formed with at least a portion of the side wall 143 and at least a portion of the side wall 145.

The plasma chamber 136 includes an upper metal component 230 that is grounded to couple the upper electrode 122 and the UEE 138 with ground. A plurality of positioning mechanisms 144, 146, and 148 are located within the upper metal component 230. For example, the positioning mechanisms 144, 146, and 148 are embedded within the upper metal component 230. Examples of a positioning mechanism include a bellow and a bladder. A positioning mechanism is made of one or more metals, e.g., aluminum, metal alloys, ferrous metals, etc.

In several embodiments, instead of the positioning mechanisms 144, 146, and 148, links are located within the upper metal component 230. Examples of links include a lead screw, a rod, a toothgear, and a pinset. Also, links are made of one or more metals. A further description of links is provided below. A link or a positioning mechanism is sometimes referred to herein as a driver.

In a number of embodiments, instead of the positioning mechanisms 144, 146, and 148, three separate heating elements, e.g., heaters, are used to control movement of the upper PEZ ring 124, the upper electrode 122, and the UEE 126. The heating element that is attached to the upper PEZ ring 124 is coupled with a power supply and the power supply is controlled by the system controller 170. The system controller 170 turns on the power supply, which then provides power to the heating element. When the heating element is provided with power, the heating element heats to push down on the upper PEZ ring 124 to move the upper PEZ ring 124 vertically downward, e.g., from the position P1 to the position P2, from the position P2 to the position P3, or from the position P3 to the position P4. Similarly, the system controller 170 turns off the power supply, which then stop supplying power to the heating element. The heating element cools to move the upper PEZ ring 124 vertically upward e.g., from the position P4 to the position P3, from the position P3 to the position P2, or from the position P2 to the position P1. In a number of embodiments, a heating element, a link, and a positioning mechanism are examples of a mechanism to adjust a position of the upper PEZ ring 124.

Similarly, a heating element is attached to the upper electrode 122 to control movement of the upper electrode 122 and another heating element is attached to the UEE 138 to control movement of the UEE 138. Each of heating element attached to the upper electrode 122 and heating element attached to the UEE 138 is controlled in a similar manner as that of the heating element attached to the upper PEZ ring 124. For example, the heating element attached to the upper electrode 122 is supplied with power under control of the system controller 170. The heating element, in this example, expands to change position of the upper electrode 122.

The upper metal component 230 is adjacent to the top wall 132. The UEE 138, the upper PEZ ring 124, the upper electrode 122 are fastened, e.g., screwed, bolted, etc., to the upper metal component 230.

The lower electrode 110 is supported on a support 190. For example, the lower electrode 110 is attached to the support 190. Examples of a support are provided in U.S. Pat. No. 7,858,898.

In several embodiments, an upper ring, made of a dielectric material, surrounds the UEE 138. In various embodiments, a lower ring, made of a dielectric material, surrounds the LEE 140.

The upper metal component 230, the top wall 132, UEE 138, the upper PEZ ring 124, the upper electrode 122, the side walls 143 and 145, the bottom wall 134, the LEE 140, the lower PEZ ring 142, the lower electrode 110, the support 190, and the lower metal collar 157 are parts of the plasma chamber 136. The bevel etcher 130 includes the plasma chamber 136. In various embodiments, the bevel etcher 130 includes the plasma chamber 136, a portion of the positioning mechanism 148 or a portion of a link that is coupled with the upper electrode 122.

The positioning mechanism 146 operates independent of operation of the positioning mechanism 148 and/or the positioning mechanism 144. For example, the positioning mechanism 146 moves the upper electrode 122 to a vertical position different than a vertical position to which the upper PEZ ring 124 and/or different than a vertical position to which the UEE 138 is moved. The positioning mechanism 148 is operated to move the upper electrode 122 and the positioning mechanism 144 is operated to move the UEE 138.

The positioning mechanism 144 is controlled by the system controller 170 via a vacuum pump and/or an air compressor and via a position controller in a similar manner in which the positioning mechanism 146 is controlled by the system controller 170 via a vacuum pump and/or an air compressor and via a position controller. Similarly, the positioning mechanism 148 is controlled by the system controller 170 via a vacuum pump and/or an air compressor and via a position controller in a similar manner in which the positioning mechanism 146 is controlled by the system controller 170 via a vacuum pump and/or an air compressor and via a position controller.

After a processing operation, e.g., a cleaning operation, an etching operation, a deposition, is performed on the substrate 116 (FIG. 2), the plasma within the gap 137 and/or 139 and/or the process gas is withdrawn from the plasma chamber 136 through a plurality of holes into a bottom space 155 and then to a vacuum pump 192. The vacuum pump 192 creates vacuum in the bottom space 155 upon receiving a signal from the system controller 170.

Figure 4:
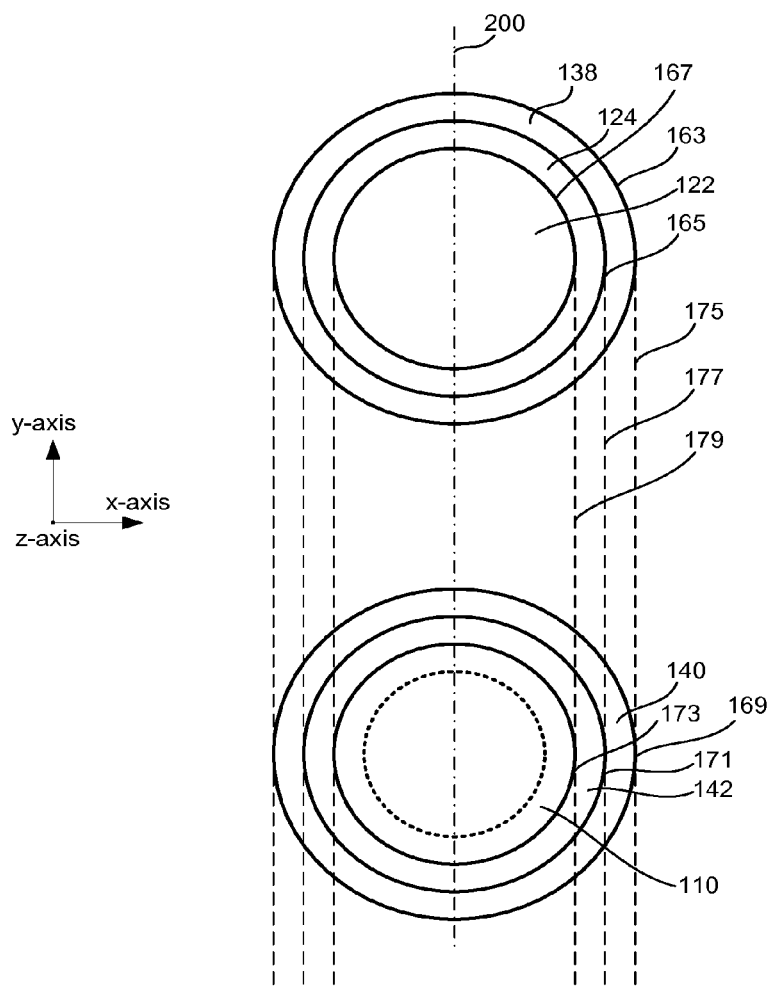
FIG. 4 is a top view of a portion of an upper electrode assembly and a portion of a lower electrode assembly, in accordance with an embodiment of the invention.

FIG. 4 is a top view of an embodiment of a portion of the upper electrode assembly and a portion of the lower electrode assembly. The portion of the upper electrode assembly includes the UEE 138, the upper PEZ ring 124, and the upper electrode 122. The lower electrode assembly includes the LEE 140, the lower PEZ ring 142, and the lower electrode 110. The center line 200 passes through a center of upper electrode 122 and a center of the lower electrode 110. In various embodiments, the center of the upper electrode 122 coincides with a centroid of the UEE 138 and of the upper PEZ ring 124. In a number of embodiments, the center of the lower electrode 110 coincides with a centroid of the LEE 140 and of the lower PEZ ring 142.

In a variety of embodiments, an edge 163 of the UEE 138 is aligned along the y-axis with an edge 169 of the LEE 140. The alignment is indicated by a line 175. In various embodiments, an edge 165 of the upper PEZ ring 124 is aligned along the y-axis with an edge 171 of the lower PEZ ring 142. The alignment is indicated by a line 177. In several embodiments, an edge 167 of the upper electrode 122 is aligned along the y-axis with an edge 173 of the lower electrode 140. The alignment is indicated by a line 179. The line 175 is tangential to the edges 163 and 169, the line 177 is tangential to the edges 165 and 171, and the line 179 is tangential to the edges 167 and 173. In some embodiments, the edge 163 lacks alignment with the edge 169, the edge 165 lacks alignment with the edge 171, and/or the edge 167 lacks alignment with the edge 173.

Figure 5:
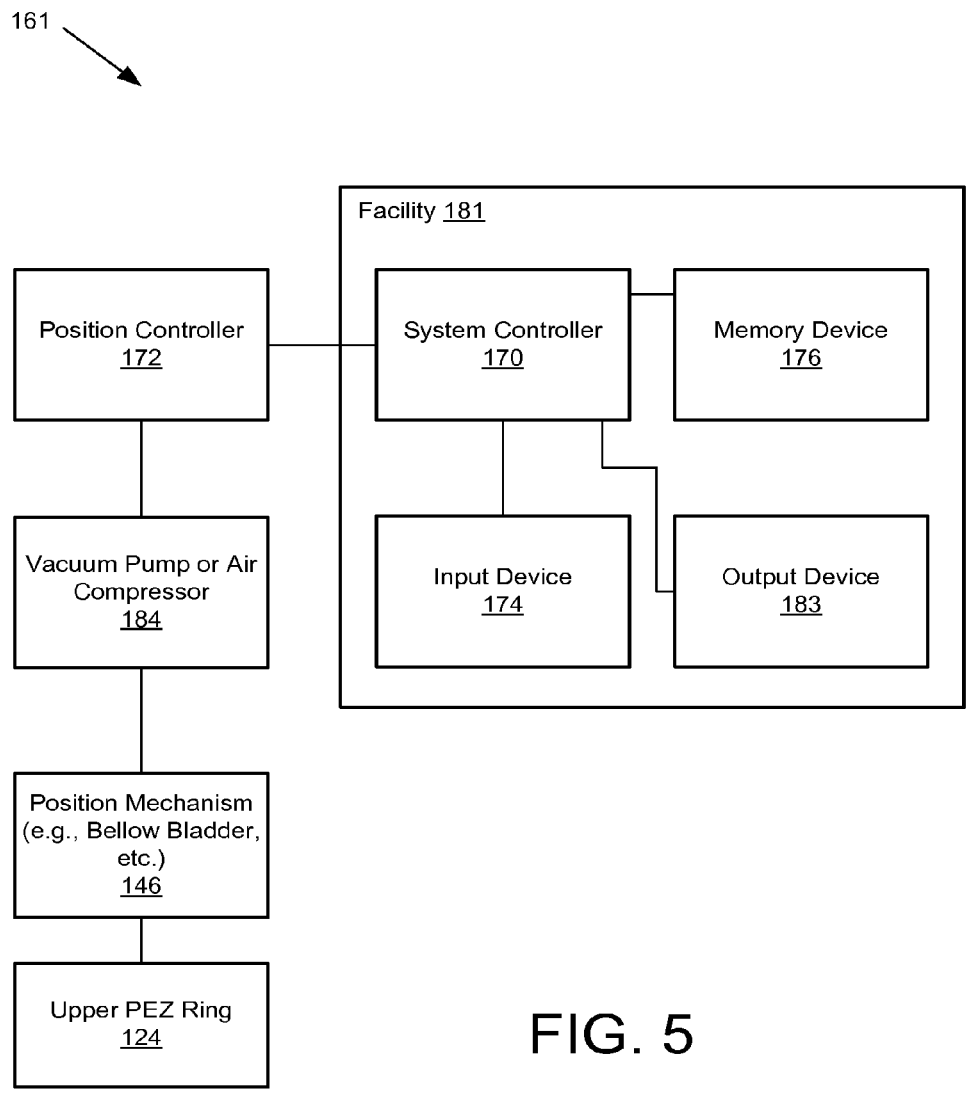
FIG. 5 is a block diagram of a system for controlling a position of the upper PEZ ring via a positioning mechanism, in accordance with an embodiment of the invention.

FIG. 5 is a block diagram of an embodiment of a system 161 for controlling a position of the upper PEZ ring 124 via the positioning mechanism 146. The system 161 includes a facility 181, e.g., a room, a building, etc., in which the system controller 170, an input device 174, a memory device 176, and an output device 183 are situated. Examples of a memory device include a random access memory (RAM) and a read-only memory (ROM). Other examples of a memory device include a flash memory, a compact disc, a magnetic memory, and a hard disk. Examples of an input device include a mouse, a keyboard, a stylus, a keypad, and a touchscreen. The output device 183 may be a display device, e.g., a cathode ray tube display, a liquid crystal display, a light emitting diode display, plasma display, etc.

The memory device 176 stores program recipes to process the substrate 116 (FIG. 2). Examples of program recipes include temperature to be maintained with the processing chamber 136 (FIG. 3), pressure to be maintained within the processing chamber 136, amount of the process gas to be supplied within the gap 137 and/or 139 (FIG. 3), a frequency of the RF power supply 152 (FIG. 3), amount of power supplied by the RF power supply 152, position of the upper electrode 122 (FIG. 3), position of the UEE 138 (FIG. 3), position of the upper PEZ ring 124, times at which signals are provided to activate the RF power supply 152 to supply RF power, times at which signals are provided to activate the vacuum pump 192 (FIG. 3) to create vacuum, and times at which signals are provided to activate the gas supply 198 to supply the process gas. The system controller 170 retrieves the program recipes from the memory device 176 and operates the gas supply 198, the RF power supply 152, the positioning mechanisms 144, 146, and 148, and the vacuum pump 192 according to the program recipes. In several embodiments, the program recipes are received from a user via the input device 174.

Upon determining that plasma is created within the gap 139 (FIG. 3), the system controller 170 retrieves a position, such as the position P1, P2, P3, or P4, of the upper PEZ ring 124 with respect to the y-axis from the memory device 176 and provides the position to a position controller 172. The position controller 172 forwards the position of the upper PEZ ring 124 to a vacuum pump and/or air compressor 184. The vacuum pump and/or air compressor 184 creates amount of vacuum and/or air compression within the positioning mechanism 146 to achieve the position of the upper PEZ ring 124 specified by the system controller 170.

Figure 6:
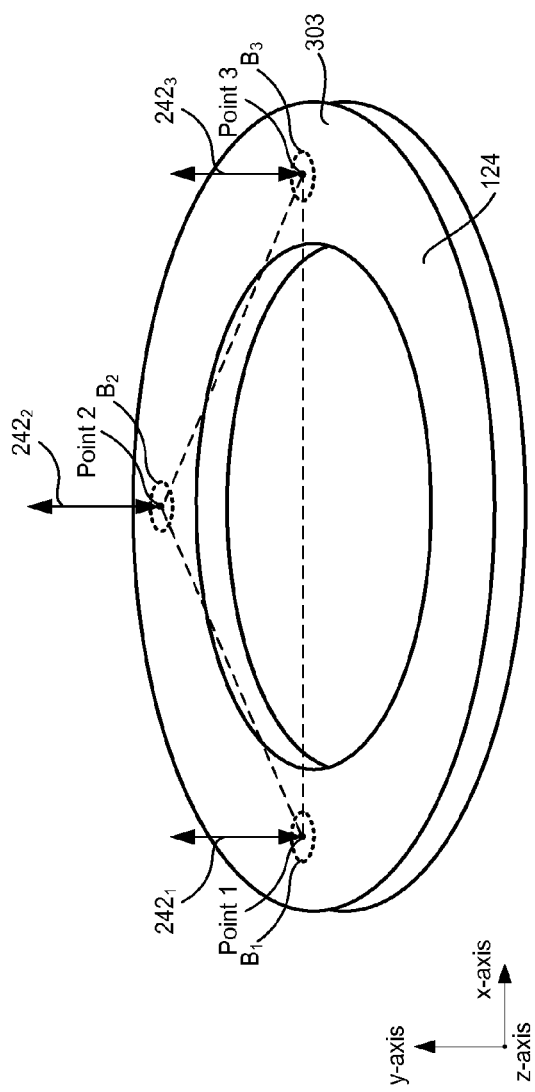
FIG. 6 is an isometric view of the upper PEZ ring, in accordance with an embodiment of the invention.

FIG. 6 is an isometric view of an embodiment of the upper PEZ ring 124. The upper PEZ ring 124 is controlled at three different points 1, 2, and 3 to achieve a position, e.g., P1, P2, P3, or P4, with respect to the y-axis. Three separate links $242_1$, $242_2$, and $242_3$ are attached to the points 1, 2, and 3 to control positions of the upper PEZ ring 124 at the points 1, 2, and 3. For example, the link $242_1$ is attached to the point 1, the link $242_2$ is attached to the point 2, and the link $242_3$ is attached to the point 3.

In several embodiments, instead of the links $242_1$, $242_2$, and $242_3$, three separate positioning mechanisms or three separate heating elements are attached to the upper PEZ ring 124 at surface areas B1, B2, and B3 on a top surface 303 of the upper PEZ ring 124. Each positioning mechanism is coupled with the system controller 170 via a different vacuum pump and/or air compressor and a different position controller.

Figure 7A:
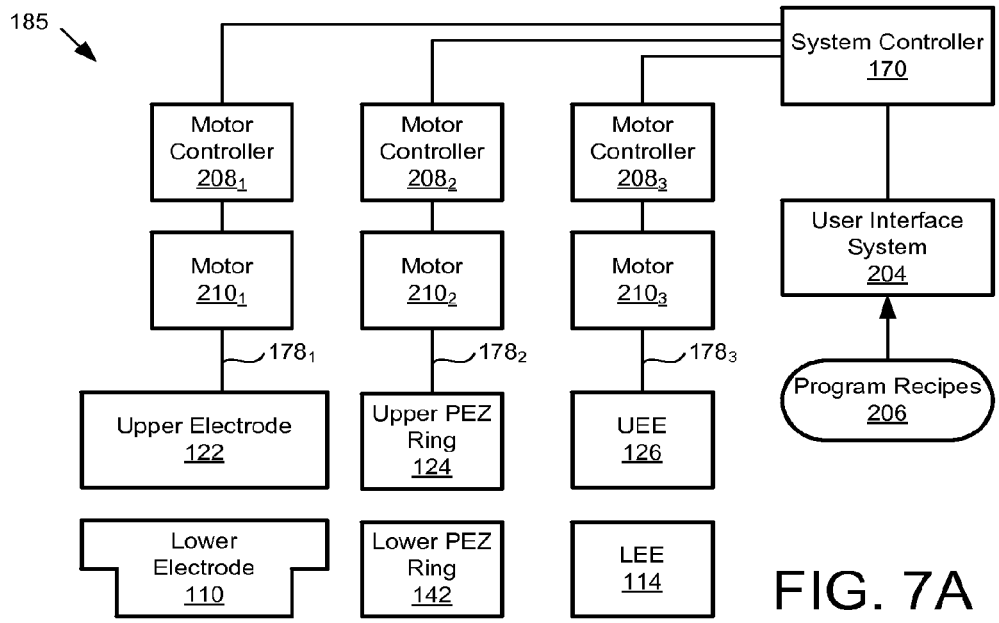
FIG. 7A is a block diagram of a system for using multiple electric motors to control a position of the upper PEZ ring independent of control of positions of an upper electrode and an upper electrode extension (UEE), in accordance with an embodiment of the invention.

FIG. 7A is a block diagram of an embodiment of a system 185 for controlling a position of the upper PEZ ring 124 independent of control of positions of the upper electrode 122 and the UEE 126. The system controller 170 receives program recipes 206 via a user interface system 204, e.g., the output device 183 (FIG. 5). The program recipes 206 are described above. In addition, the program recipes 206 include a number of rotations to be executed by a motor $210_2$ to achieve the position P1, P2, P3, or P4 of the upper PEZ ring 124. The program recipes 206 further include a number of rotations to be executed by a motor $210_1$ to achieve a position of the upper electrode 122 and a number of rotations to be executed by a motor $210_3$ to achieve a position of the UEE 126.

Upon retrieving the program recipes 206 from the memory device 176 (FIG. 5), the system controller 170 sends a signal to a motor controller $208_1$, sends a signal to a motor controller $208_2$, and sends a signal to a motor controller $208_3$. The signal sent to the motor controller $208_1$ includes a number of rotations of the motor $210_1$ to achieve a vertical position, along the y-axis, of the upper electrode 122. Moreover, the signal sent to the motor controller $208_2$ includes a number of rotations of the motor $210_2$ to achieve a vertical position, along the y-axis, of the upper PEZ ring 124. Also, the signal sent to the motor controller $208_3$ includes a number of rotations of the motor $210_3$ to achieve a vertical position, along the y-axis, of the UEE 126.

The motor $210_1$ rotates a number of rotations that is received from the motor controller $208_1$. Similarly, the motor $210_2$ rotates a number of rotations that is received from the motor controller $208_2$ and the motor $210_3$ rotates a number of rotations that is received from the motor controller $208_3$.

When the motor $210_1$ rotates, a link $178_1$ that is attached to the motor $210_1$ also rotates. The link $178_1$ forms a mating connecting with the upper electrode 122. For example, the link $178_1$ includes screw threads and complementary threads are formed within the upper electrode 122 to allow the upper electrode 122 to move vertically along the y-axis with the rotation of the link $178_1$.

Similarly, when the motor $210_2$ rotates, a link $178_2$ that is attached to the motor $210_2$ also rotates. For example, when the motor $210_2$ rotates in a clockwise direction, the link $178_2$ rotates in the clockwise direction and when the motor $210_2$ rotates in a counterclockwise direction, the link $178_2$ rotates in the counterclockwise direction. The link $178_2$ forms a mating connecting with the upper PEZ ring 124. For example, the link $178_2$ includes screw threads and complementary threads are formed within the upper PEZ ring 124 to allow the upper PEZ ring 124 to move vertically along the y-axis with the rotation of the link $178_2$.

Also, when the motor $210_3$ rotates, a link $178_3$ that is attached to the motor $210_3$ also rotates. The link $178_3$ forms a mating connecting with the UEE 126. For example, the link $178_3$ includes screw threads and complementary threads are formed within the UEE 126 to allow the UEE 126 to move vertically along the y-axis with the rotation of the link $178_3$.

In a number of embodiments, when the link $178_2$ rotates in the clockwise direction for a number of rotations, the upper PEZ ring 124 achieves the position P1 between the upper electrode 122 and the UEE 126. Moreover, when the link $178_2$ rotates further in the clockwise direction for a number of rotations, the upper PEZ ring 124 achieves the position P2 between the upper electrode 122 and the UEE 126. Also, when the link $178_2$ rotates further in the clockwise direction for a number of rotations, the upper PEZ ring 124 achieves the position P3 between the upper electrode 122 and the UEE 126. When the link $178_2$ rotates further in the clockwise direction for a number of rotations, the upper PEZ ring 124 achieves the position P4 between the upper electrode 122 and the UEE 126.

Similarly, when the link $178_2$ rotates in the counterclockwise direction for a number of rotations, the upper PEZ ring 124 achieves the position P3 between the upper electrode 122 and the UEE 126 from the position P4. Moreover, when the link $178_2$ rotates further in the counterclockwise direction for a number of rotations, the upper PEZ ring 124 achieves the position P2 between the upper electrode 122 and the UEE 126 from the position P3. Also, when the link $178_2$ rotates further in the counterclockwise direction for a number of rotations, the upper PEZ ring 124 achieves the position P1 between the upper electrode 122 and the UEE 126 from the position P2. When the link $178_2$ rotates further in the clockwise direction for a number of rotations, the upper PEZ ring 124 loses its position between the upper electrode 122 and the UEE 126.

A link is connected to a motor via a connection mechanism, e.g., gears. For example, the link $178_1$ is connected to the motor $210_1$ via a connection mechanism, the link $178_2$ is connected to the motor $210_2$ via a connection mechanism, and the link $178_3$ is connected to the motor $210_3$ via a connection mechanism.

In various embodiments, one motor is connected to the links $178_1$ and $178_3$. When the single motor rotates, the links $178_1$ and $178_3$ rotate simultaneously to achieve a position of the upper electrode 122 and the UEE 126.

Figure 7B:
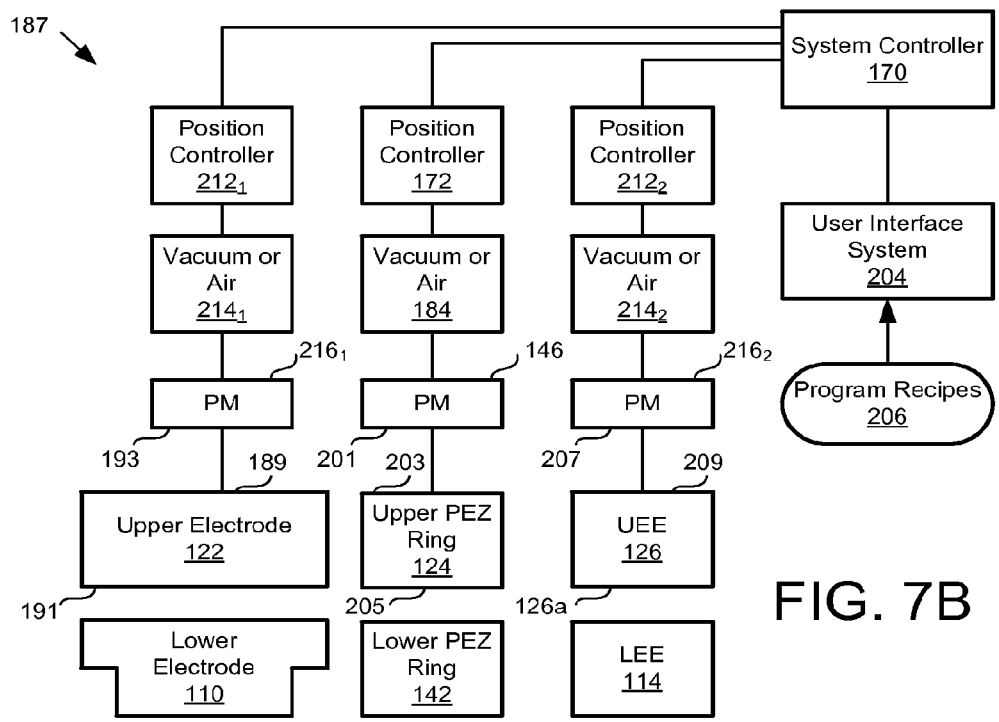
FIG. 7B is a block diagram of a system for using multiple positioning mechanisms to control a position of the upper PEZ ring independent of control of positions of an upper electrode and an upper electrode extension (UEE), in accordance with an embodiment of the invention.

FIG. 7B is a block diagram of an embodiment of a system 187 for using a positioning mechanism to control a position of the upper PEZ ring 124. The position of the upper PEZ ring 124 is controlled independent of control of positions of the upper electrode 122 and the UEE 126.

The system controller 170 receives program recipes 206 via the user interface system 204. In addition, the program recipes 206 include an amount of vacuum and/or air to be created within a volume of the positioning mechanism 146 to move the positioning mechanism 146 by a distance to further achieve the position P1, P2, P3, or P4 of the upper PEZ ring 124. The program recipes 206 further include an amount of vacuum and/or air to be created within a volume of the positioning mechanism $216_1$ to move the positioning mechanism $216_1$ by a distance to achieve a position of the upper electrode 122. The program recipes 206 also include an amount of vacuum and/or air to be created within a volume of the positioning mechanism $216_2$ to move the positioning mechanism $216_2$ by a distance to achieve a position of the UEE 126.

Upon retrieving the program recipes 206 from the memory device 176 (FIG. 5), the system controller 170 sends a signal to a position controller $212_1$, sends a signal to the position controller 172, and sends a signal to a position controller $212_2$. The signal sent to the position controller $212_1$ includes an amount of vacuum to be generated by a vacuum pump and/or air compressor $214_1$ to move the positioning mechanism $216_1$ by a distance to achieve a position of the upper electrode 122. Moreover, the signal sent to the position controller 172 includes an amount of vacuum to be generated by a vacuum pump and/or air compressor 184 to move the positioning mechanism 146 by a distance to achieve a position of the upper PEZ ring 124. Also, the signal sent to the position controller $212_2$ includes an amount of vacuum to be generated by a vacuum pump and/or air compressor $214_2$ to move the positioning mechanism $216_2$ by a distance to achieve a position of the UEE 126.

The vacuum pump and/or air compressor $214_1$ generates an amount of vacuum within the positioning mechanism $216_1$ and the amount is received from the position controller $212_1$. Similarly, the vacuum pump and/or air compressor 184 generates an amount of vacuum within the positioning mechanism 146 and the amount is received from the position controller 172. Also, the vacuum pump and/or air compressor $214_2$ generates an amount of vacuum within the positioning mechanism $216_2$ and the amount is received from the position controller $212_2$.

The position of the upper electrode 122 changes when the position of the positioning mechanism $216_1$ changes. For example, a bottom surface 193 of the positioning mechanism $216_1$ abuts a top surface 189 of the upper electrode 122. When a position of the bottom surface 193 of the positioning mechanism $216_1$ changes, a position of the top surface 189 changes to achieve a position of the bottom surface 191 of the upper electrode 122 with respect to the y-axis. The position of the bottom surface 191 may be P1, P2, P3, or P4.

Similarly, the position of the upper PEZ ring 124 changes when the position of the positioning mechanism 146 changes. For example, a bottom surface 201 of the positioning mechanism 146 abuts a top surface 203 of the upper PEZ ring 124. When a position of the bottom surface 201 of the positioning mechanism 146 changes, a position of the top surface 203 changes to achieve a position of the bottom surface 205 of the upper PEZ ring 124 with respect to the y-axis. The position of the bottom surface 205 may be P1, P2, P3, or P4.

Moreover, the position of the UEE 126 changes when the position of the positioning mechanism $216_2$ changes. For example, a bottom surface 207 of the positioning mechanism $216_2$ abuts a top surface 209 of the UEE 126. When a position of the bottom surface 207 of the positioning mechanism $216_2$ changes, a position of the top surface 209 changes to achieve a position of the bottom surface 126a of the UEE 126 with respect to the y-axis. The position of the bottom surface 126a may be P1, P2, P3, or P4.

In a number of embodiments, when the positioning mechanism 146 moves downward in a vertical direction for a distance, the upper PEZ ring 124 achieves the position P1 between the upper electrode 122 and the UEE 126. In a number of embodiments, the vertical direction is along an orientation that is substantially perpendicular, e.g., perpendicular or about perpendicular, to a top surface of the lower electrode 110. Moreover, when the positioning mechanism 146 moves further in the downward vertical direction for a distance, the upper PEZ ring 124 achieves the position P2 between the upper electrode 122 and the UEE 126. Also, when the positioning mechanism 146 moves further in the downward vertical direction for a distance, the upper PEZ ring 124 achieves the position P3 between the upper electrode 122 and the UEE 126. When the positioning mechanism 146 moves further in the downward vertical direction for a distance, the upper PEZ ring 124 achieves the position P4 between the upper electrode 122 and the UEE 126.

Similarly, when the positioning mechanism 146 moves in an upward vertical direction for a distance, the upper PEZ ring 124 achieves the position P3 between the upper electrode 122 and the UEE 126 from the position P4. Moreover, when the positioning mechanism 146 moves further in the upward vertical direction for a distance, the upper PEZ ring 124 achieves the position P2 between the upper electrode 122 and the UEE 126 from the position P3. Also, when the positioning mechanism 146 moves further in the upward vertical direction for a distance, the upper PEZ ring 124 achieves the position P1 between the upper electrode 122 and the UEE 126 from the position P2. When the positioning mechanism 146 moves further in the upward vertical direction for a distance, the upper PEZ ring 124 loses its position between the upper electrode 122 and the UEE 126.

In various embodiments, one positioning mechanism is attached to the positioning mechanisms $216_1$ and $216_2$. When the single positioning mechanism changes its position with respect to the y-axis, the positioning mechanisms $216_1$ and $216_2$ also change their positions to achieve a position of the upper electrode 122 and the UEE 126.

FIG. 8 is a block diagram of an embodiment of a system 215 for controlling a position of the upper PEZ ring 124 via the motor $210_2$. As shown in FIG. 8, the motor controller $208_2$ and the motor $210_2$ are located within a housing 240. The link $178_2$ may be a lead screw, a rod, a toothgear, a pinset, or a combination thereof. When the link $178_2$ is a toothgear, a mating toothgear is fabricated within the upper PEZ ring 124 to allow the upper PEZ ring 124 to move vertically along the y-axis with rotation of the motor $210_2$.

Figure 9:
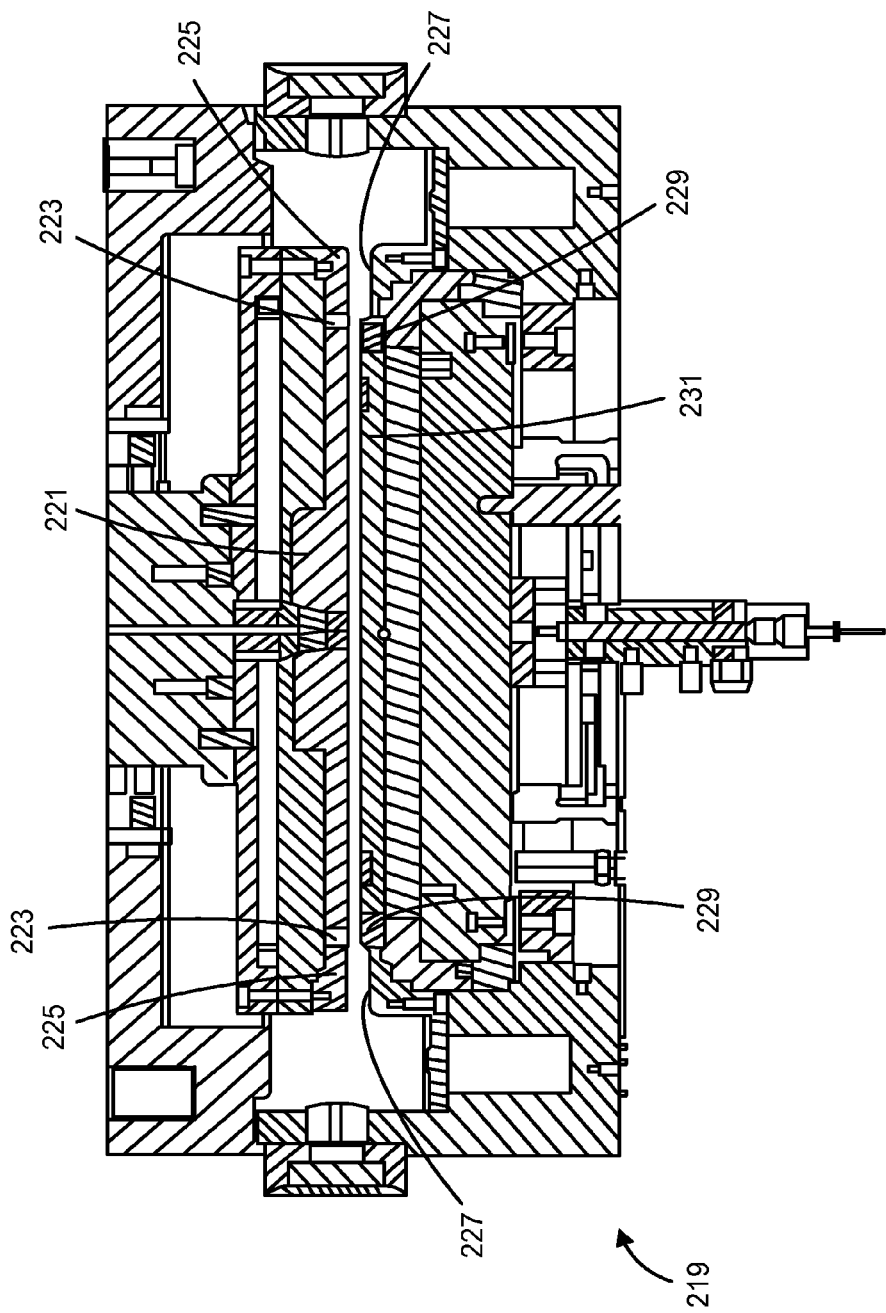
FIG. 9 is a cross-sectional view of an embodiment of a plasma processing chamber, in accordance with an embodiment of the invention.

FIG. 9 is a cross-sectional view of an embodiment of a plasma processing chamber 219. The plasma processing chamber 219 includes an upper electrode 221, an upper PEZ ring 223, an UEE 225, an LEE 227, a lower PEZ ring 229, and a lower electrode 231. As shown, the upper PEZ ring 223 is not clamped with the upper electrode 221 or with the UEE 225. The upper PEZ ring 223 moves along the y-axis independent of whether the upper electrode 221 or the UEE 225 moves along the y-axis.

Figure 10:
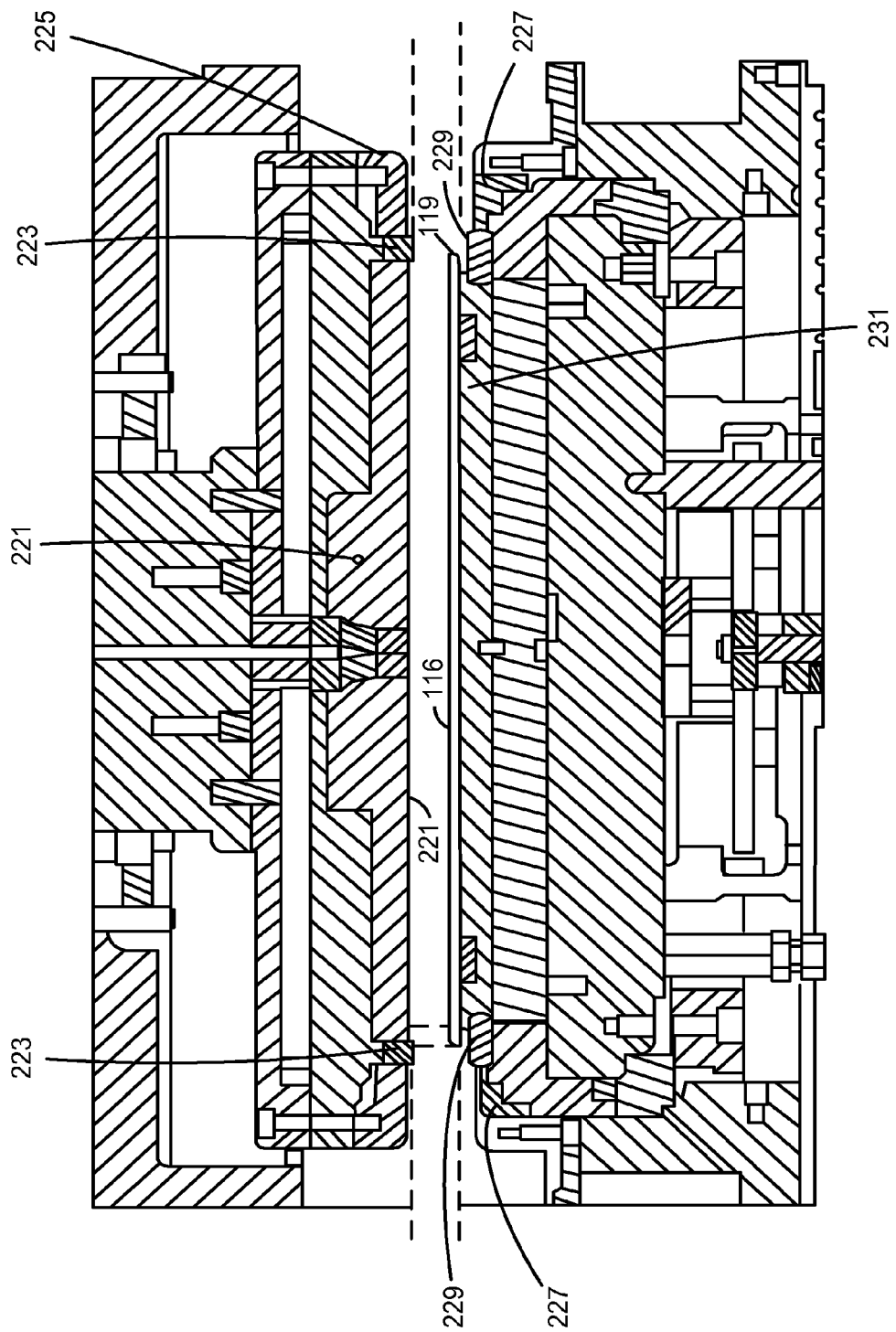
FIG. 10 is a zoom-in of the cross-section view of the plasma processor chamber of FIG. 9, in accordance with an embodiment of the invention.

FIG. 10 is a zoom-in of the cross-section view of an embodiment of the plasma processor chamber 219. The substrate 116 is placed between the upper electrode 221 and the lower electrode 231. The substrate 116 also lies between the upper PEZ ring 223 and the lower PEZ ring 229. The lower PEZ ring 229 shields the lower electrode 231 from plasma generated within an edge processing region.

Figure 11:
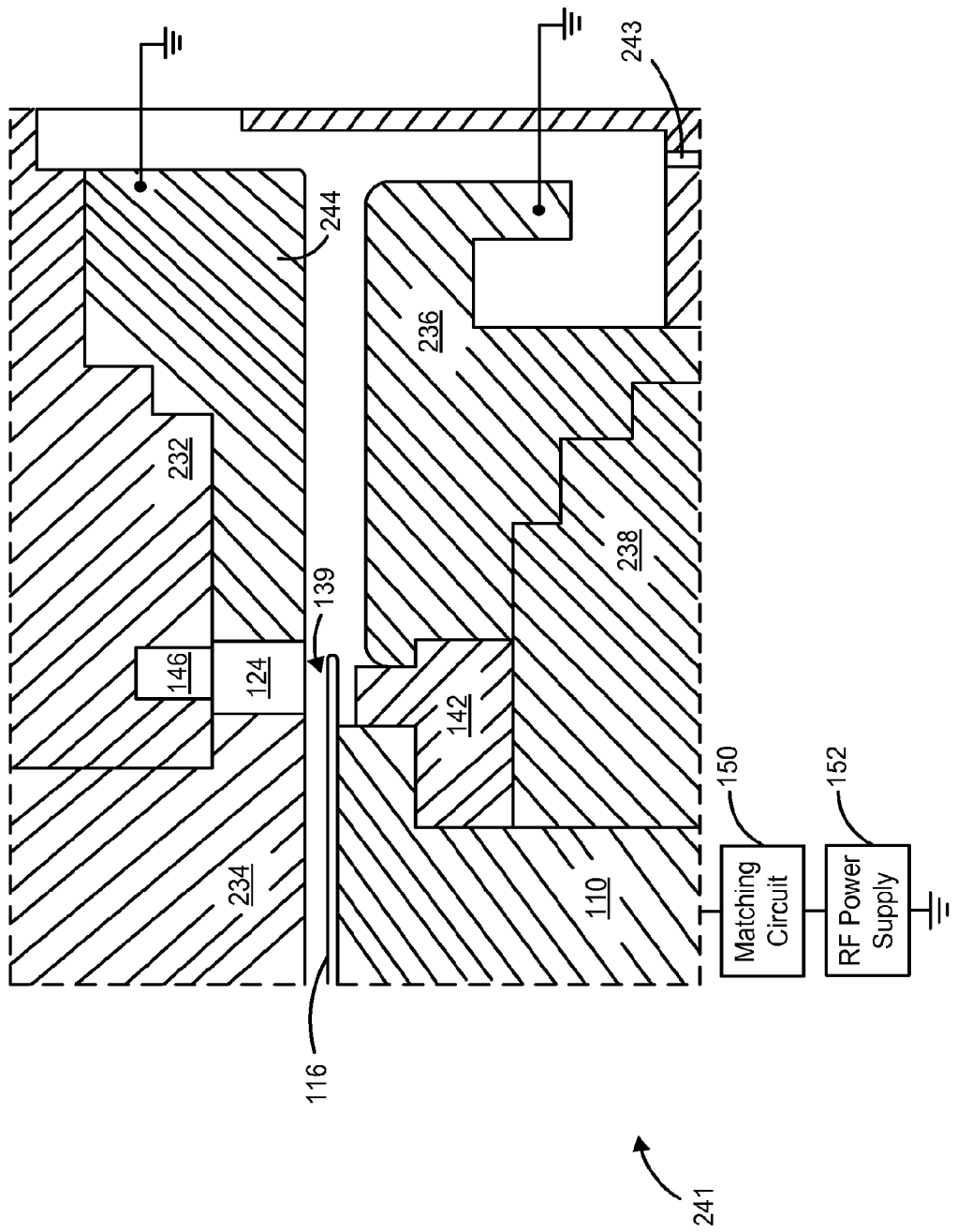
FIG. 11 is a cross-sectional view of a portion of a plasma processing chamber, in accordance with an embodiment of the invention.

FIG. 11 is a cross-sectional view of an embodiment of a portion 241 of a plasma processing chamber. The portion 241 includes an upper electrode 234 that is grounded. The portion 241 further includes the lower electrode 110. The lower PEZ ring 142 horizontally abuts the lower electrode 110 and a lower electrode extension 236 horizontally abuts the lower PEZ ring 142. Also, a ring 239, made of a dielectric material, surrounds the lower electrode 110. The ring 239 electrically isolates the lower electrode 110 from the lower electrode extension 236 and from the bottom wall 134 (FIG. 3) of the processing chamber 136 (FIG. 3). The lower electrode extension 236 abuts the ring 239. The lower electrode 110, the lower PEZ ring 142, the ring 239, and the lower electrode extension 236 form part of a lower electrode assembly.

The upper PEZ ring 124 abuts the upper electrode 234. An upper metal component 232 abuts the upper electrode 234, the upper PEZ ring 124, and the upper electrode extension 244. The upper electrode extension 244 abuts the upper PEZ ring 124. The upper PEZ ring 124 is coupled with the positioning mechanism 146. For example, the positioning mechanism 146 abuts the upper PEZ ring 124. The positioning mechanism 146 vertically moves up and down to change a position of the upper PEZ ring 124. The position of the upper PEZ ring 124 is changed to achieve the position P1, P2, P3, or P4. Any remaining plasma, after a processing operation, and process gases are captured by the vacuum pump 192 (FIG. 3) from the gap 139 via holes 243.

Figure 12:
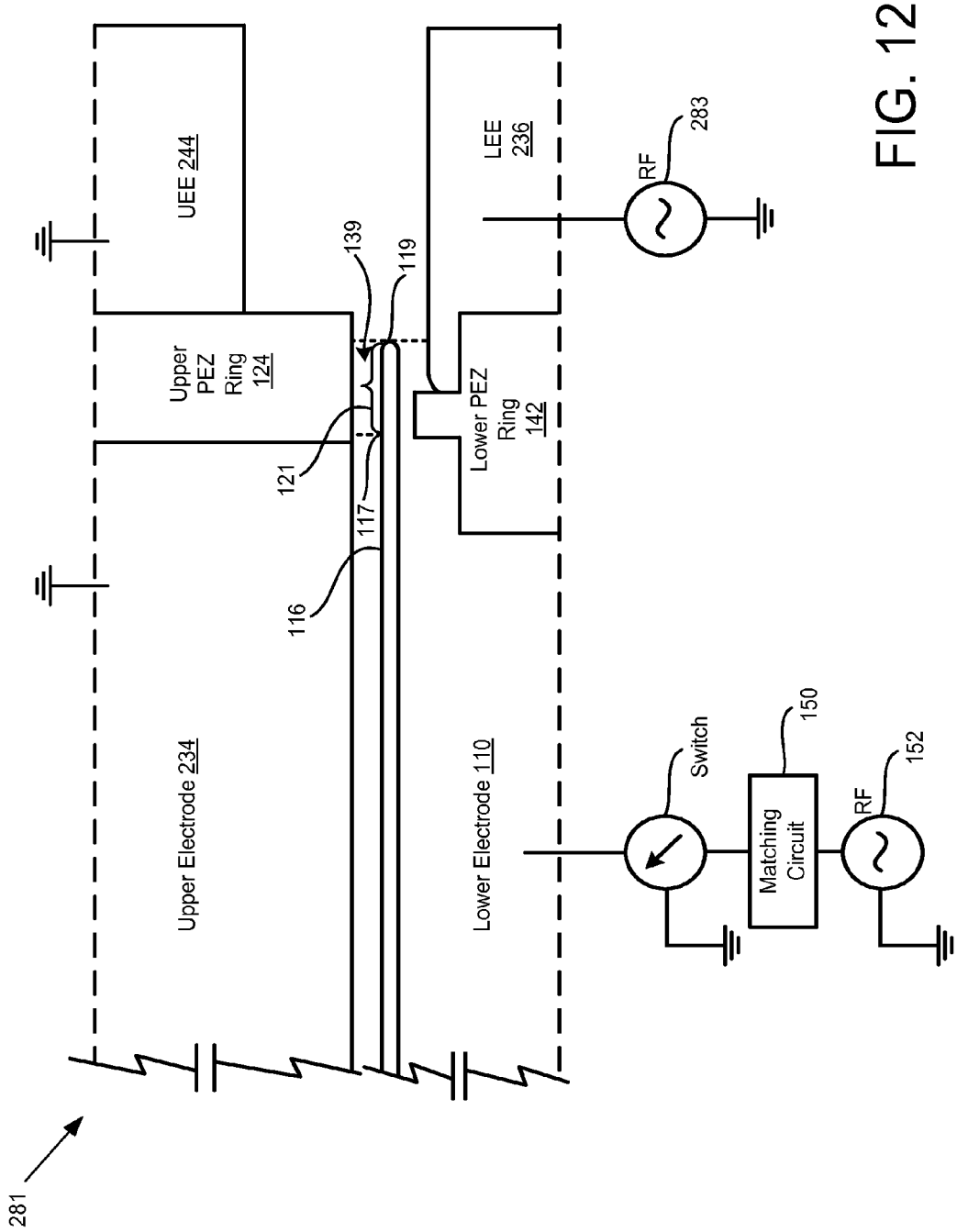
FIG. 12 is a diagram of a system for generating plasma within an edge processing region, in accordance with an embodiment of the invention.

FIG. 12 is a diagram of an embodiment of a system 281 for generating plasma within an edge processing region. When power is supplied by the RF power supply 152 to the LEE 236 via the lower electrode 110 and the process gas are present within the gap 139, plasma is created within an edge processing region.

In a number of embodiments, instead of supplying RF power from the RF power supply 152, power is supplied by another RF power supply 283 that is coupled to the LEE 236. In these embodiments, the UEE 244 is grounded via the upper metal component 232 (FIG. 11) and the lower electrode 110 is also grounded via a switch. Also, the upper electrode 234 is grounded. The supply of power from the RF power supply 283 creates plasma within edge processing region 111 (FIG. 1A). During a processing operation performed on the substrate 116, the upper PEZ ring 124 is moved between different positions, e.g., positions P1 thru P4, without a need to move the upper electrode 234 and a need to move the UEE 244. The movement of the upper PEZ ring 124 allows control of an amount of plasma within the gap 139 to further allow achievement of different rates of etching of a region of substrate 116 within the edge exclusion region 121.

Figure 13:
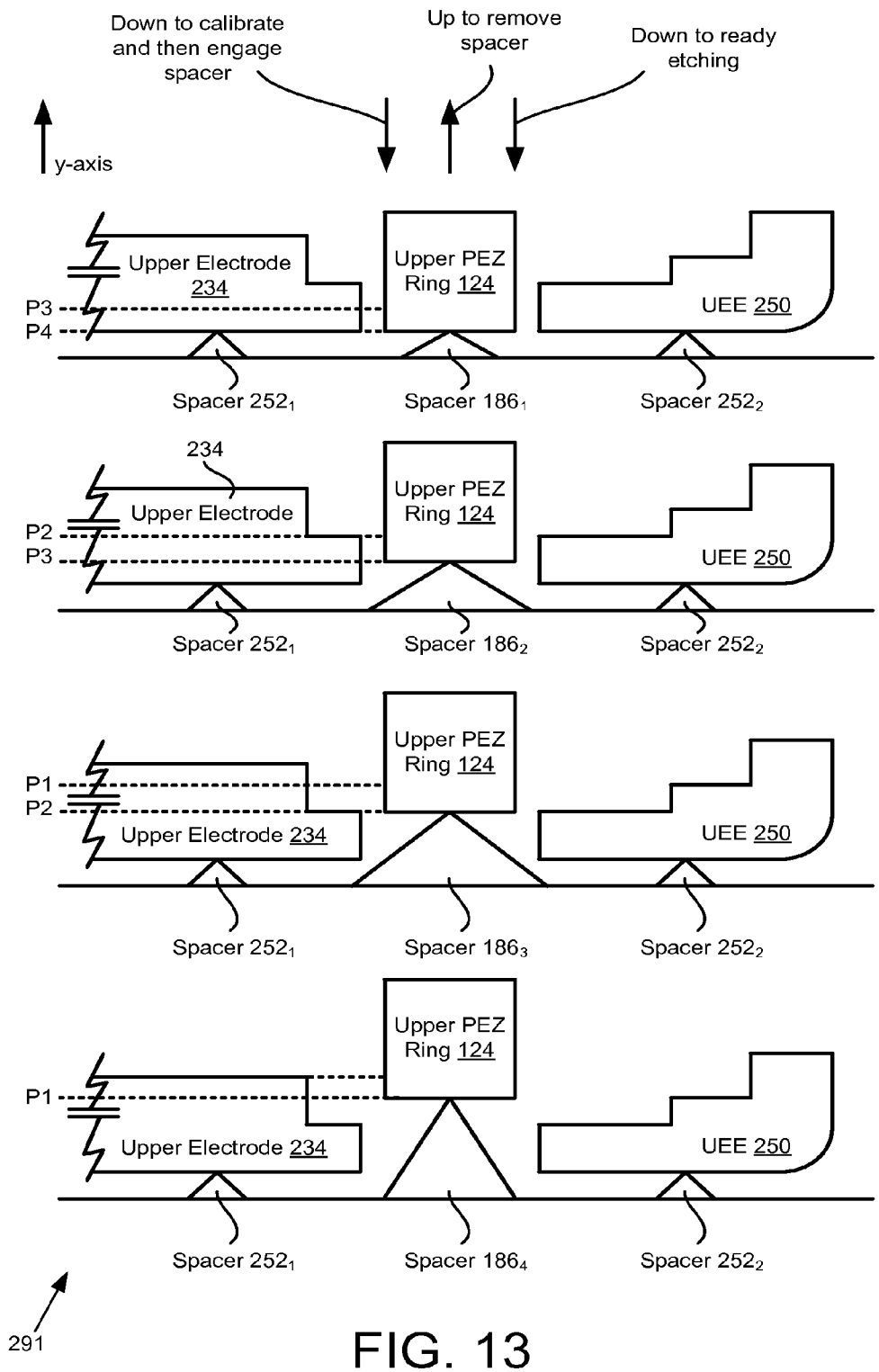
FIG. 13 is a diagram of a system for calibrating and using spacers to determine positions of the upper PEZ ring within a plasma processing chamber, in accordance with an embodiment of the invention.

FIG. 13 is a diagram of a system 291 for calibrating and using spacers to determine the positions P1 thru P4. The upper electrode 234 and an UEE 250 are calibrated via spacers $252_1$ and $252_2$ to be placed at the position P4 along the y-axis. The upper PEZ ring 124 is moved down along the y-axis until the upper PEZ ring 124 touches a spacer $186_1$, which is placed at the position P4. When the PEZ ring 124 touches the spacer $186_1$, movement of the PEZ ring 124 is stopped. After calibrating the position P4 of the upper PEZ ring 124, the upper PEZ ring 124 is moved up along the y-axis to remove the spacer $186_1$.

After calibrating the upper PEZ ring 124 for the position P4, the upper PEZ ring 124 is calibrated for the position P3. The upper PEZ ring 124 is calibrated for the position P3 in a manner similar to calibrating the upper PEZ ring 124 for the position P4. For example, the upper PEZ ring 124 is moved down along the y-axis until the upper PEZ ring 124 touches a spacer $186_2$, which is placed at the position P3. The spacer $186_2$ is taller than the spacer $186_1$. When the PEZ ring 124 touches the spacer $186_2$, movement of the PEZ ring 124 is stopped. After calibrating the position P3 of the upper PEZ ring 124, the upper PEZ ring 124 is moved up along the y-axis to remove the spacer $186_2$.

Moreover, after calibrating the upper PEZ ring 124 for the position P3, the upper PEZ ring 124 is calibrated for the position P2. The upper PEZ ring 124 is calibrated for the position P2 in a manner similar to calibrating the upper PEZ ring 124 for the position P3 or P4. For example, the upper PEZ ring 124 is moved down along the y-axis until the upper PEZ ring 124 touches a spacer $186_3$, which is placed at the position P2. The spacer $186_3$ is taller than the spacer $186_2$. When the PEZ ring 124 touches the spacer $186_3$, movement of the PEZ ring 124 is stopped. After calibrating the position P2 of the upper PEZ ring 124, the upper PEZ ring 124 is moved up along the y-axis to remove the spacer $186_3$.

After calibrating the upper PEZ ring 124 for the position P2, the upper PEZ ring 124 is calibrated for the position P1. The upper PEZ ring 124 is calibrated for the position P1 in a manner similar to calibrating the upper PEZ ring 124 for the position P2, P3, or P4. For example, the upper PEZ ring 124 is moved down along the y-axis until the upper PEZ ring 124 touches a spacer $186_4$, which is placed at the position P1. The spacer $186_4$ is taller than the spacer $186_3$. When the PEZ ring 124 touches the spacer $186_4$, movement of the PEZ ring 124 is stopped. After calibrating the position P1 of the upper PEZ ring 124, the upper PEZ ring 124 is moved up along the y-axis to remove the spacer $186_4$.

It should be noted that any order of calibrating the upper PEZ ring 124 is used. For example, the upper PEZ ring 124 is calibrated for the position P1 first, then for the positions P2, P3, and P4. As another example, the upper PEZ ring 124 is calibrated for the position P1, then for the position P4, then for the position P2, and then for the position P3. It should be noted that during calibration of the upper PEZ ring 124 between the positions P1 thru P4, the spacers $252_1$ and $252_2$ are placed at the position P1 to calibrate the upper electrode 234 and the UEE 250 to be placed at the position P1. In several embodiments, during calibration of the upper PEZ ring 124 between the positions P1 thru P4, the spacers $252_1$ and $252_2$ are placed at the position P2, P3, or P4, to calibrate the upper electrode 234 and the UEE 250 to be placed at the position P2, P3, or P4.

After the calibration of the upper PEZ ring 124 for all the positions P1 thru P4, plasma is created within the plasma chamber 136 (FIG. 3) and the upper PEZ ring 124 is moved down along the y-axis to prepare the substrate 116 for a processing operation, e.g., etching, depositing, cleaning, etc.

In a number of embodiments, the spacers $186_1$, $186_2$, $186_3$, and $186_4$ are used after the calibration to facilitate placement of the upper PEZ ring 124 at the corresponding positions P1, P2, P3, and P4. For example, the spacer $186_1$ is used during or after creation of plasma within the plasma chamber 136 to prevent further downward vertical movement from the position P4 of the upper PEZ ring 124.

Figure 14:
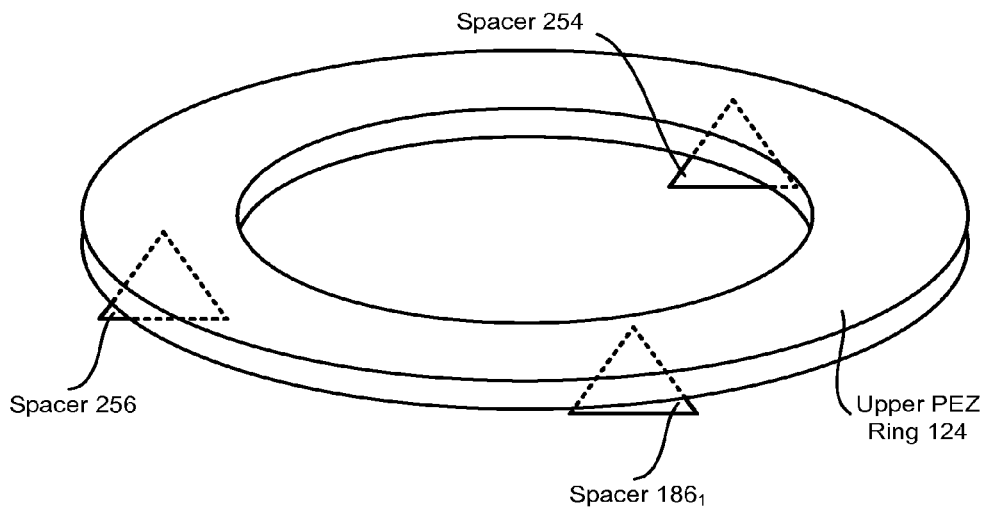
FIG. 14 is an isometric view of the upper PEZ ring that is supported by multiple spacers, in accordance with an embodiment of the invention.
Figure 15:
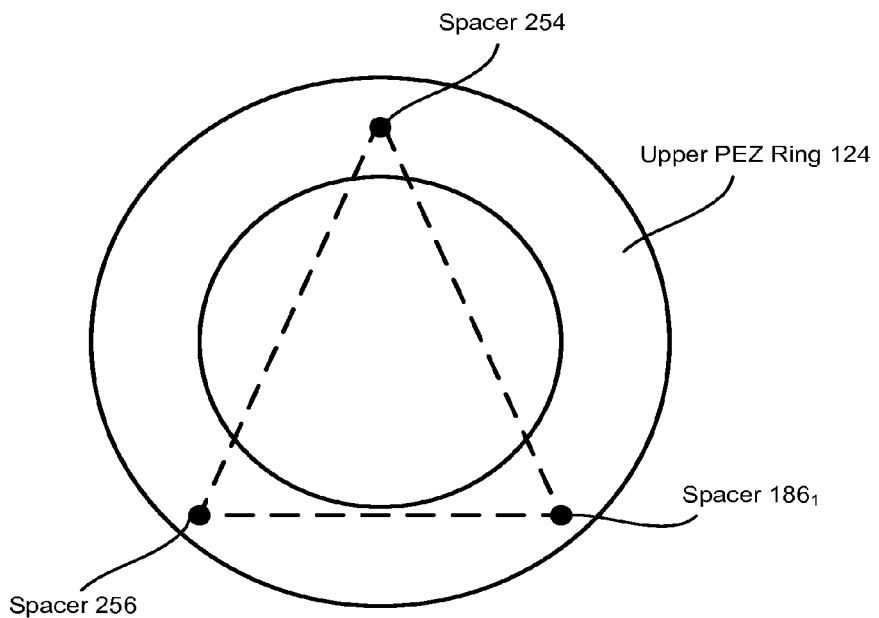
FIG. 15 is a top view of the upper PEZ ring that is supported by the spacers, in accordance with an embodiment of the invention.

FIG. 14 is an isometric view of an embodiment of the upper PEZ ring 124 that is supported by multiple spacers $186_1$, 254, and 256 and FIG. 15 is a top view of the upper PEZ ring 124 that is supported by the spacers $186_1$, 254, and 256. The spacers $186_1$, 254, and 256 are placed at the position P1 to calibrate the upper PEZ ring 124. In several embodiments, the spacers $186_1$, 254, and 256 are placed at the position P1 to form a triangle between the spacers $186_1$, 254, and 256. In a number of embodiments, multiple spacers are placed under the upper PEZ ring 124 at the position P2, P3, or P4, to form a triangle between the spacers to calibrate the upper PEZ ring 124.

Figure 16:
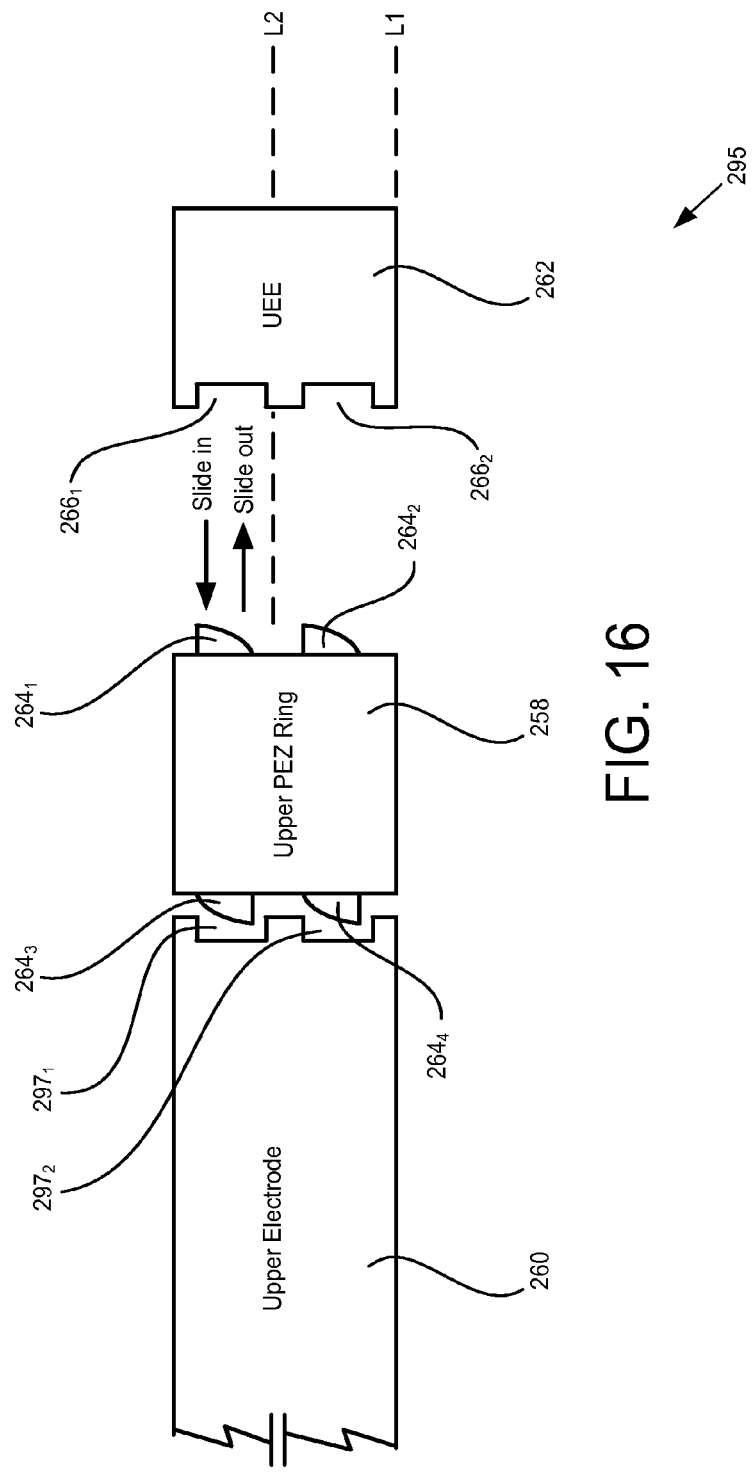
FIG. 16 is a diagram of an embodiment of a system in which an upper PEZ ring is equipped with tensioners to achieve one or more positions, in accordance with an embodiment of the invention.

FIG. 16 is a diagram of an embodiment of a system 295 in which an upper PEZ ring 258 is equipped with tensioners 264 to achieve one or more positions, e.g., L1 and L2. The tensioners 264 perform spring action of sliding in and out of slots 266 of an UEE 262 and in and out of slots 297 of an upper electrode 260.

When a link coupled with the upper PEZ ring 258 is rotated in the clockwise direction or a positioning mechanism coupled with the upper PEZ ring 258 is moved in a vertical downward direction or a heating element attached to the upper PEZ ring 258 expands in the vertical downward direction, the tensioner $264_4$ extends into the slot $297_1$ and the tensioner $264_2$ extends into the slot $266_1$. The tensioner $264_4$ extends into the slot $297_1$ and the tensioner $264_2$ extends into the slot $266_1$ to achieve the position L2.

Moreover, when a link coupled with the upper PEZ ring 258 is rotated further in the clockwise direction or a positioning mechanism coupled with the upper PEZ ring 258 is moved further in a vertical downward direction or a heating element attached to the upper PEZ ring 258 expands further in the vertical downward direction, the tensioner $264_4$ retracts from the slot $297_1$ and extends into the slot $297_2$, the tensioner $264_3$ extends into the slot $297_1$, the tensioner $264_2$ retracts from the slot $266_1$ and extends into the slot $266_2$, and the tensioner $264_1$ extends into the slot $266_1$. The tensioners $264_3$ and $264_4$ extend into the slots 297 and the tensioners $264_1$ and $264_2$ extend into the slots 266 to achieve the position L1.

Similarly, when a link coupled with the upper PEZ ring 258 is rotated in the counterclockwise direction or a positioning mechanism coupled with the upper PEZ ring 258 is moved in a vertical upward direction or a heating element attached to the upper PEZ ring 258 contracts in the vertical upward direction, the tensioner $264_4$ retreats from the slot $297_2$ and the tensioner $264_2$ retreats from the slot $266_2$. Moreover, the tensioner $264_3$ retreats from the slot $297_1$ and the tensioner $264_1$ retreats from the slot $266_1$. Also, the tensioner $264_4$ expands into the slot $297_1$ and the tensioner $264_2$ expands into the slot $266_1$ to allow the upper PEZ ring 258 to achieve the position L2.

Moreover, when a link coupled with the upper PEZ ring 258 is rotated further in the counterclockwise direction or a positioning mechanism coupled with the upper PEZ ring 258 is moved further in a vertical upward direction or a heating element attached to the upper PEZ ring 258 further contracts in the vertical upward direction, the tensioner $264_4$ retreats from the slot $297_1$ and the tensioner $264_2$ retreats from the slot $266_1$. The tensioner $264_4$ retreats from the slot $297_1$ and the tensioner $264_2$ retreats from the slot $266_1$ to decouple the upper PEZ ring 258 at the position L1 from the upper electrode 260 and the UEE 262.

It should be noted that although two positions L1 and L2 are illustrated in FIG. 16, in a number of embodiments, any number of positions are used. Moreover, any number of slots and tensioners to achieve the number of positions are used. For example, the upper PEZ ring 124 is moved to a position that is substantially parallel, e.g., same or substantially the same level measured along the y-axis, to a position of the upper electrode 122. As another example, the upper PEZ ring 124 is moved to protrude past the position P1 of the upper electrode 122 in a downward vertical direction toward the lower PEZ ring 112. As yet another example, the upper PEZ ring 124 is moved to recess away from the position P1 of the upper electrode 122 and in a vertical direction away from the lower PEZ ring 112.

Figure 17:
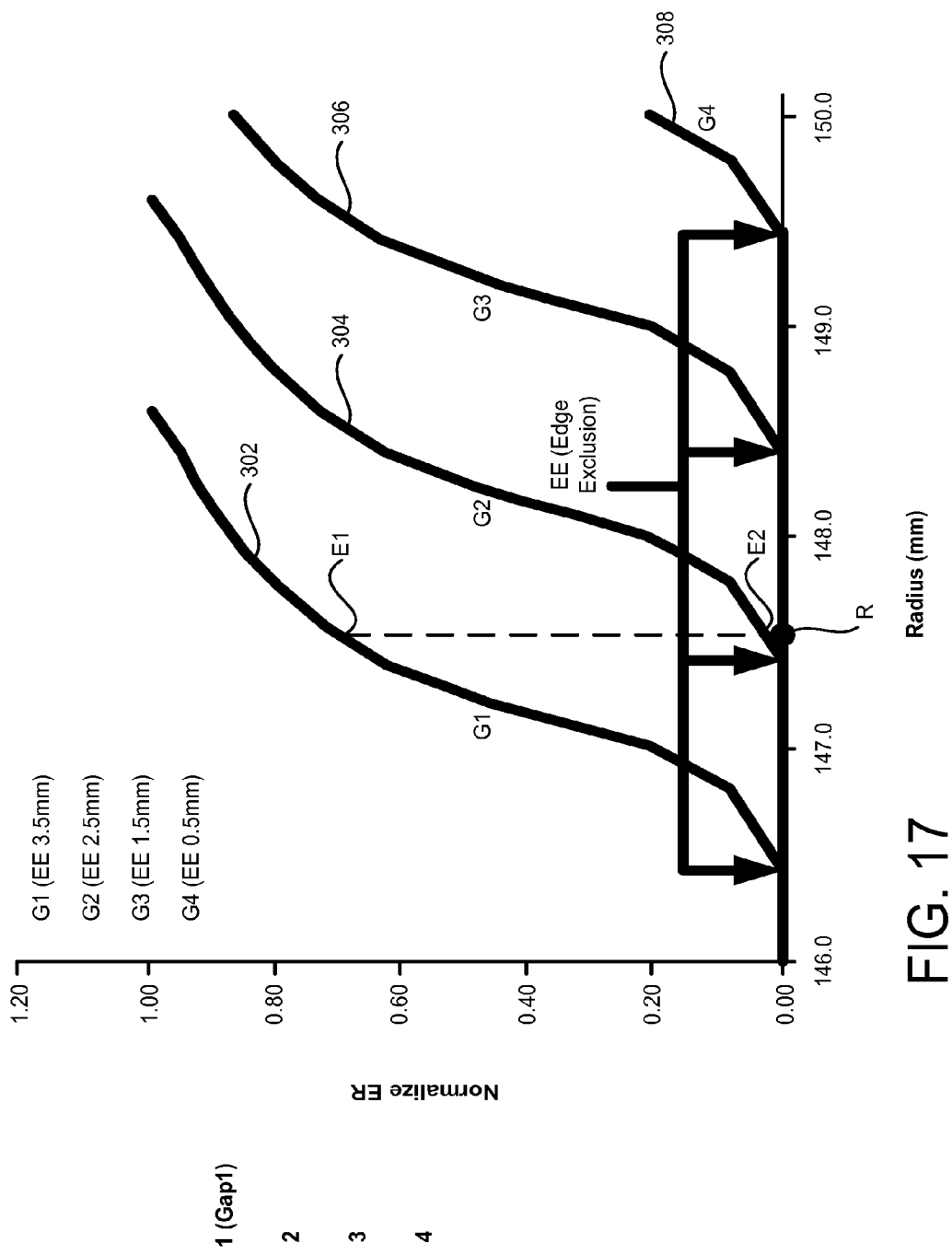
FIG. 17 is a graph that is a plot of normalized etch rate (ER) versus a radius on a substrate, in accordance with an embodiment of the invention.

FIG. 17 is a graph that is an embodiment of a plot of normalized etch rate (ER) versus a radius on the substrate 116 (FIG. 1). The radius on the substrate 116 is measured from a center of the substrate 116. The plot includes a curve 302 that is generated when the gap G1 is formed. The plot further includes a curve 304 that is generated when the gap G2 is formed, a curve 306 that is generated when the gap G3 is formed, and a curve 308 that is generated when the gap G4 is formed. As shown in the plot, for a radius R on the substrate, a normalized etch rate E1 is greater than a normalized etch rate E2. The normalized etch rate E1 is measured when the gap G1 exists between the upper PEZ ring 124 and the substrate 116 (FIG. 1). The normalized etch rate E2 is measured when the gap G2 exists between the upper PEZ ring 124 and the substrate 116. The gap G1 allows a higher amount of plasma than an amount of plasma within the gap G2 to achieve the higher etch rate E1 at the radius R.

It should be noted that although the above-described embodiments include vertical movement of an upper PEZ ring, an upper electrode, and/or an UEE, in various embodiments, instead of the vertical movement, an oblique, e.g., slanted, skewed, sloping, etc., movement may occur.

Embodiments described herein may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium. The computer readable medium is any data storage device that can store data, which can be thereafter be read by a computer system. Examples of the computer readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A plasma chamber, comprising:
   a lower electrode having a surface for supporting a substrate, the lower electrode coupled with a radio frequency (RF) power supply;
   an upper electrode disposed over the lower electrode, the upper electrode being electrically grounded;
   an upper dielectric ring surrounding the upper electrode, the upper dielectric ring adjusted using a mechanism for setting a vertical position of the upper dielectric ring;
   an upper electrode extension surrounding the upper dielectric ring, the upper electrode extension being electrically grounded;
   a lower dielectric ring surrounding the lower electrode, the lower dielectric ring set at a level that is below a level of the surface of the lower electrode; and
   a lower electrode extension surrounding the lower dielectric ring, the lower electrode extension arranged opposite the upper electrode extension;
   wherein an edge processing region is defined between the upper and lower dielectric rings and the upper and lower electrode extensions, and when the substrate is present on the surface of the lower electrode, an edge of the substrate extends into the edge processing region.

2. The chamber of claim 1, wherein the mechanism for setting the vertical position of the upper dielectric ring has positions that place the upper dielectric ring closer toward the lower dielectric ring or away from the lower dielectric ring.

3. The chamber of claim 1, wherein upper dielectric ring is settable into positions that (a) are substantially parallel to the upper electrode, (b) protrude past a level of the upper electrode and toward the lower dielectric ring, or (c) are recessed away from a level of the upper electrode and away from the lower dielectric ring.

4. The chamber of claim 1, wherein the vertical position is along an orientation that is substantially perpendicular to the surface of the lower electrode.

5. The chamber of claim 1, wherein the vertical position is controlled by controlling the upper dielectric ring at a plurality of points on a top surface of the upper dielectric ring.

6. The chamber of claim 1, wherein the vertical position is controlled to modify an area covered by the edge processing region, wherein the area defines an amount of area of the edge of the substrate that is processed.

* * * * *

UNITED STATES PATENT AND TRADEMARK OFFICE
CERTIFICATE OF CORRECTION

| | | |
|---|---|---|
| PATENT NO. | : 9,799,496 B2 | Page 1 of 1 |
| APPLICATION NO. | : 14/920821 | |
| DATED | : October 24, 2017 | |
| INVENTOR(S) | : Kim et al. | |

It is certified that error appears in the above-identified patent and that said Letters Patent is hereby corrected as shown below:

On the Title Page

Item (72), please change the inventor's name from "Yansung Kim" to --Yunsang Kim--.

Signed and Sealed this
Thirteenth Day of November, 2018

Andrei Iancu
*Director of the United States Patent and Trademark Office*